United States Patent [19]

Takahashi et al.

[11] Patent Number: 5,223,719
[45] Date of Patent: Jun. 29, 1993

[54] MASK FOR USE IN A CHARGED PARTICLE BEAM APPARATUS INCLUDING BEAM PASSING SECTIONS

[75] Inventors: Yasushi Takahashi, Kawasaki; Kiichi Sakamoto, Tokyo; Yoshihisa Oae, Kawasaki; Hiroshi Yasuda, Yokohama; Nobuyuki Yasutake, Tokyo, all of Japan

[73] Assignee: Fujitsu Limited, Kawasaki, Japan

[21] Appl. No.: 724,338

[22] Filed: Jul. 5, 1991

[30] Foreign Application Priority Data

| Jul. 6, 1990 | [JP] | Japan | 2-178927 |
| Jul. 9, 1990 | [JP] | Japan | 2-181894 |
| Aug. 18, 1990 | [JP] | Japan | 2-217850 |

[51] Int. Cl.$^5$ .................................. H01J 37/04
[52] U.S. Cl. ........................ 250/492.2; 250/398
[58] Field of Search .......... 250/492.2 R, 492.22, 250/492.23, 396 R, 398; 219/121.25, 121.26

[56] References Cited

U.S. PATENT DOCUMENTS

| 4,145,597 | 3/1979 | Yasuda | 219/121.25 |
| 4,914,304 | 4/1990 | Koyama | 250/492.2 |
| 5,036,209 | 7/1991 | Kataoka et al. | 250/492.2 |
| 5,105,089 | 4/1992 | Yamada | 250/492.2 |

Primary Examiner—Jack I. Berman
Assistant Examiner—Jim Beyer
Attorney, Agent, or Firm—Staas & Halsey

[57] ABSTRACT

A charged particle beam mask and apparatus and method of using the same employing a mask that includes a substrate and a plurality of substantially rectangular beam passing sections arranged in parallel and to have a trapezoidal shape. In addition, the masks having a matrix of irradiation areas formed thereon where each irradiation area has a matrix of block patterns, are aligned and selectively irradiated to form a desired pattern on an object.

16 Claims, 48 Drawing Sheets

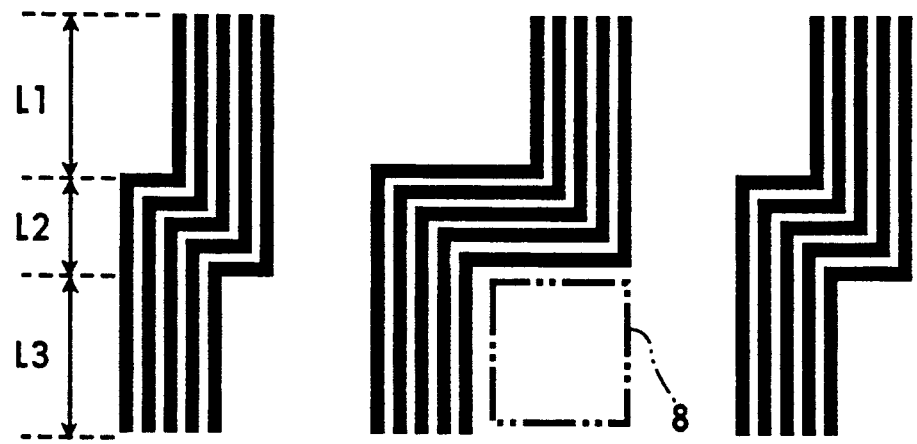
Fig. 4(a)  Fig. 4(b)  Fig. 4(c)
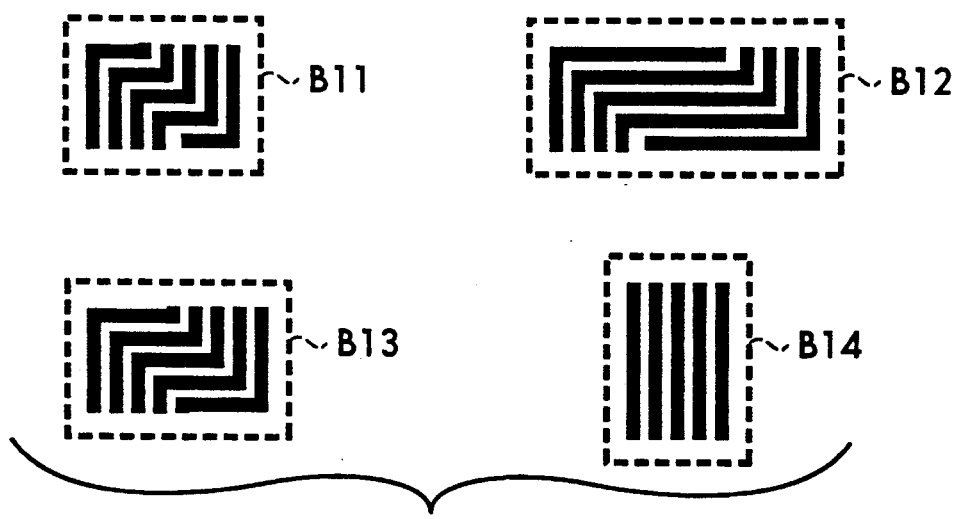
Fig. 5

$l_1 < l_2 < l_3 \cdots l$ $\theta = \dfrac{\phi}{2}$ $\ell_1 < \ell_2 < \ell_3 \cdots \ell_n$ $\theta = \dfrac{\phi}{2} = \dfrac{90°}{2} = 45°$

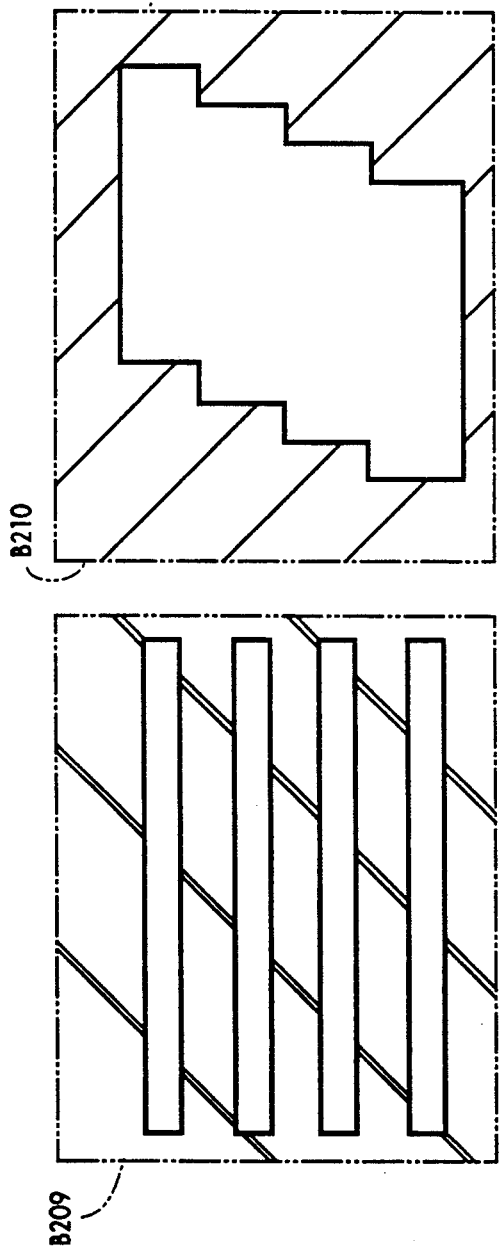
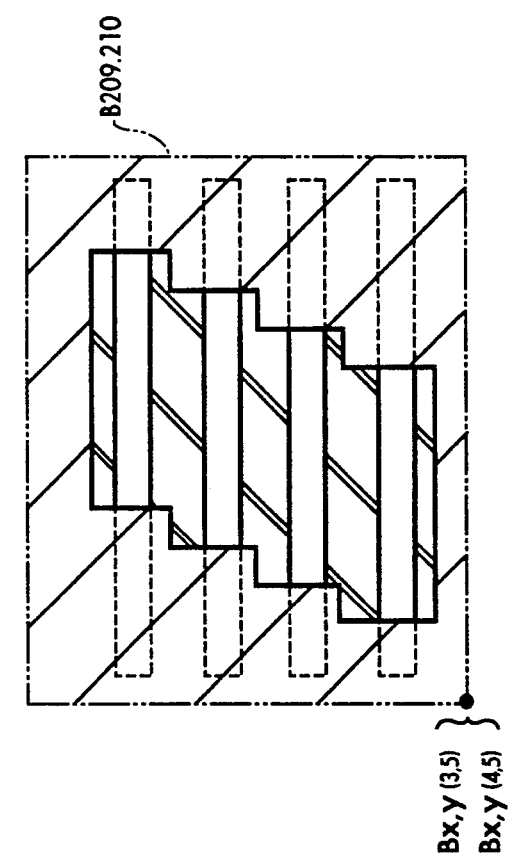
Fig. 25 (a)
Fig. 25 (b)
Fig. 25 (c)

①~⑤ :

MASK FOR USE IN A CHARGED PARTICLE BEAM APPARATUS INCLUDING BEAM PASSING SECTIONS

BACKGROUND OF THE INVENTION

1. Field of the Invention

The present invention relates to a charged particle beam and method of using same; and more specifically, to an electron beam exposing mask and apparatus which enable, when exposing a plurality of patterns having different details but a similar overall shape, the exposing of patterns with the least number of mask patterns.

2. Related Art

With the rapid development in high density integration of LSI, charged particle exposure methods are replacing conventional photolithography. Such charged particle methods include, for example, electron beam and X-ray. FIG. 1 schematically illustrates a conventional electron beam exposing apparatus. In FIG. 1, reference numeral 1 denotes an electron gun; reference numeral 2 denotes an electron beam; reference numerals 3, 4, 5 denote mask plates; reference numerals 6, 7 denote electrostatic deflectors; reference numeral 8 denotes an electromagnetic deflector; reference numeral 9 denotes a wafer. The square permeable patterns (slit) 3A, 4A, 5A are respectively formed on the mask plates 3, 4, 5. The permeable patterns 3A and 4A have sides that coincide; and the permeable pattern 5A has a side oriented at 45° with respect to the sides of the permeable patterns 3A, 4A.

In the FIG. 1 electron beam apparatus, the permeable patterns 3A, 4A, 5A are aligned to overlay each other. These patterns shape a section of an electron beam 2 by deflecting the electron beam 2 with electrostatic deflectors 6, 7 and electromagnetic deflector 8. The electron beam 2 initially has a square shape as it passes through the permeable pattern 3A. It is then given a rectangular shape as it passes through the permeable pattern 4A. The electron beam 2 is then given a trapezoidal shape as it passes through the permeable pattern 5A.

An advantage of the FIG. 1 apparatus is that it has a throughput that is higher than that of a so-called point beam system electron beam exposure apparatus. This is because it is possible to form a variable trapezoidal shape, a variable triangle shape and a variable rectangular shape. However, repetitive basic patterns, such as a semiconductor memory (e.g., DRAM or SRAM) cannot be easily formed with such electron beam exposing apparatus. This is because it is impossible to expose such repeated patterns with single exposure. Therefore, high throughput cannot always be attained because the repetitive pattern must be formed by a sequence of a rectangular and/or triangle patterns.

The FIG. 2 apparatus has been proposed to improve such throughput problems. In FIG. 2, reference numeral 11 denotes an electron gun; reference numeral 12 denotes an electron beam; reference numeral 13 denotes a mask plate (rectangular shaping aperture); reference numeral 14 denotes an electromagnetic lens; reference numeral 15 denotes a block pattern selection reflector for selecting a block pattern explained later; reference numeral 16 denotes a stencil mask; reference numeral 17 denotes a reduction lens system; reference numeral 18 denotes a wafer. The stencil mask 16 has various permeable patterns, so-called block patterns 20 (also called mask patterns) on a substrate 19 of the stencil mask 16.

FIG. 3 is a plan view of an example of the block pattern 20.

The FIG. 2 electron beam apparatus can expose a single basic pattern by repeatedly using, at a high frequency, the stencil mask 16. However, since the size of the stencil mask 16 is limited, a number of block patterns 20 on the stencil mask 16 is also restricted. Therefore, a large number of block patterns cannot be provided on the stencil mask 16.

As a means for solving this problem, it has been proposed to increase the number of types of patterns by using a plurality of stencil masks and interchanging these masks. But, the interchange of block mask requires a considerable time; and thereby, high throughput cannot be attained.

Word line and bit line patterns connected to a memory cell and logic circuit wiring patterns also appear repeatedly within a memory chip. Therefore, a block exposure system has been employed in order to improve the efficiency of exposing such patterns. FIG. 2 shows only one of a plurality of such patterns provided on the stencil mask 16 (beam passing mask). To expose such patterns, the desired one of the patterns is selected and this selected pattern is irradiated with a rectangular electron beam that is shaped by the mask plate 13.

However, wiring patterns of an LSI including wiring pattern for bypassing obstructions such as contact holes and transistors requires a variety of bending wiring block patterns. Moreover, in the case a staircase power supply wiring pattern, many different staircase block patterns are required.

As a result, block patterns for bending wiring patterns and block patterns for a staircase power supply wiring patterns can occupy a large part of a sheet of stencil mask. This limits the kinds of other block patterns. In addition, the block patterns for bending wiring patterns is less frequently used in comparison with the block patterns for other wirings such as word lines. This increases the time to expose a desired pattern and reduces the throughput.

In FIG. 4(a), the straight portions of wirings L1, L3 are exposed by selecting the block pattern B14 (refer to FIG. 5) on stencil mask 16 and then irradiating it with the rectangular shape electron beam 2. The bending portion of wiring L2 is exposed by selecting the block pattern B11 (refer to FIG. 5) on stencil mask 16 and then irradiating it with the rectangular shape electron beam 2. Similarly, in the FIGS. 4(b), 4(c), the bending portion of wiring L2 is exposed by selecting the block patterns B12 and B13 (refer to FIG. 5) of stencil mask 16 and then irradiating it with the rectangular electron beam 2. The block patterns B11 through B13 are composite patterns of the L type bending pattern and the clank type bending pattern.

The four kinds of block patterns B11 through B14 are restricted in length and width and are used to expose the three bending patterns shown in FIGS. 4(a) through 4(c). These wiring patterns typically occur in word lines and bit lines and in exclusive OR gate circuits. These patterns occur because wiring must bypass obstructions such as contract holes and transistors. Such patterns must be kept parallel and at equal intervals.

FIGS. 6(a) and 6(b) show staircase power supply wiring pattern diagrams that illustrate a problem of existing exposure systems. In FIG. 6(a), the staircase power supply wiring pattern 9 is exposed by selecting a block pattern B15 (refer to FIG. 7) of stencil mask 16 and irradiating it with a rectangular shape electron beam 2. The parallel line portion L4 of the power supply wiring pattern 9 is exposed by selecting a block pattern B17 (refer to FIG. 7) of stencil mask 16 and irradiating it with a rectangular shape electron beam 2. In the same way, in FIG. 6(b), the mirror pattern portion 9' is exposed by selecting a block pattern B16 (refer to FIG. 7) of stencil mask 16 and irradiating it with the rectangular shape electron beam 2. Thus, three kinds of block, patterns B15 through B17 are required to expose the power supply wiring patterns shown in FIGS. 6(a) and 6(b). Such a staircase power supply wiring pattern is used, for example, at a point for connecting upper and lower layers of multilayer wiring.

FIG. 8 shows a wiring pattern that illustrate another problem of existing exposure systems. In FIG. 8(a), the parallel portion L5 is long. The L type bending block patterns B18 through B20 are used for the bending portions L6, L7 and L8 of the wiring pattern. But, as explained above, the bending block patterns B11 through B14, b17 through B20 and the staircase block patterns B15 and B16 occupy a large area of the stencil mask 16. This prevents a variety of block patterns from being formed on the stencil mask 16. As a result, increased time is needed to select block patterns. This prevents high speed exposure.

In addition, the wiring patterns for an address decoder and for logic gate circuits of a memory cell comprise repetitive patterns. In these circuits, the contact hole positions vary in a fixed fashion. Therefore, different block patterns must be provided on the stencil mask 16 (beam passing mask) for each of the different contact hole positions.

Accordingly, many block patterns are required for logic gate circuits and address decoders. These patterns occupy a large area of the stencil mask 16. Thus other needed block patterns cannot fit on the stencil mask 16. As a result, increased time is needed to select block patterns. This prevents high speed exposure. For example, to form the pattern shown in FIG. 10(a), various block patterns B21 through B26 must be provided on the stencil mask 16 as shown in FIG. 10(b). This gives rise to a number of problems as noted below.

1. Formation of the FIG. 10(a) pattern requires many block patterns such as B21 through B26. Namely, formation of first and second address decoder contact hole groups L11 and L13 requires use of block pattern B21 of stencil mask 16. This pattern is then irradiated with a rectangular electron beam.

2. For example, after an exposing area on a wafer is moved through deflection processing via the rectangular electron beam 2, the exposing area is irradiated with the rectangular electron beam 2 through the block pattern B21. Formation of the third contact hole group L15 requires selection of a block pattern B22 of stencil mask 16. This pattern is then irradiated with a rectangular electron beam 2. Thereafter, the electron beam 2 after passing through the pattern B22 is deflected to expose the pattern B22 to predetermined exposure area on the wafer. The block patterns B24 through B26 are sequentially selected and irradiated with the rectangular electron beam 2. Lastly, formation of the linear patterns L12 and L14 requires selection of the block pattern B23 of stencil mask 16. This pattern is then irradiated with the rectangular electron beam 2.

As explained above, exposure of logic gate circuit patterns such as an address decorder requires that the stencil mask include a plurality of block patterns B21 through B26. Thereby, the number of block patterns formed on the block mask for other exposure patterns is restricted.

3. A long time is required to select a desired block pattern; thus, preventing high speed exposure. Namely, when forming the pattern of the FIG. 10(a) address decoder, a longer time is needed to select block pattern B21 to expose the first and second contact hole groups L11, L13; and to sequentially select block patterns B24 through B26 to expose the third contact hole group L15. More particularly, a longer time is required for comparison and collation of exposure data D and block pattern data defining the stencil mask 16 and for positioning the stencil mask 16.

4. If electron beam exposure is to use a stencil mask with block patterns, then when the design of an LSI circuit is changed the shape of exposure patterns must change too. Thus, a new block mask must be generated in accordance with the change. As explained above, electron beam exposure using a block mask lacks flexibility in comparison with direct electron beam exposure using a variable rectangular beam.

In summary, with conventional block exposure, a large number of block patterns is needed. These patterns have different details but a similar overall shape. As a result, the exposure time is too long even when block exposure is employed.

OBJECTS OF THE INVENTION

It is an object of the present invention to provide an exposure method, and apparatus and mask, using a low number of block patterns including a plurality of patterns having different details but a similar overall shape.

It is another object of the present invention to provide an efficient method and apparatus and mask, for exposing bending patterns of a large scale integrated circuit (LSI) using a minimum number of block patterns.

It is a further object of the present invention to provide an exposure method and apparatus and mask, that improves throughput of exposure by increasing the kinds of exposure patterns that may be formed at one exposure shot.

It is still another object of the present invention to provide an exposure method, apparatus and mask that minimizes the number of needed block patterns.

It is still a further object of the present invention to provide an exposure method, apparatus and mask that improves block pattern exposure throughput.

To achieve the above and other objects, the present invention provides an exposure mask having a pattern formed by permeable holes to shape a charged particle beam irradiating the pattern into the shape of the pattern, wherein the pattern is formed by a first rectangular permeable hole having predetermined width and length and a plurality of second rectangular permeable holes which are provided in parallel with the first permeable hole and respectively provided with a length which sequentially becomes longer by a fixed amount, and a trapezoidal shape permeable pattern which, as a whole, can be formed by the first and second permeable holes.

To achieve the above and other objects, the present invention also provides a charged particle beam exposure apparatus comprising a means for generating rectangular charge particle beam, a fist deflection means for deflecting the beam to a predetermined position on the mask, a substrate for aligning irradiated with the beam having permeated the aligning mask and a second deflection means for deflecting the beam having passed through the exposure mask, wherein the exposure mask includes at least one permeable hole pattern and beam cutoff portion that prevents the beam from irradiating a part of the permeable hole pattern.

To achieve the above and other objects, the present invention also provides a charged particle beam exposure apparatus comprising means for generating a rectangular charged particle beam, an exposure mask irradiated with the beam and a substrate irradiated with the shaped beam having passed through the exposure mask, wherein the exposure mask includes a permeable hole pattern comprising a first rectangular permeable hole having a predetermined width and length and a plurality of the second rectangular permeable holes which are provided in parallel with the first permeable hole with at least an edge of the one end sequentially deviated by a fixed amount from the edge position of the first permeable hole and wherein the beam is further shaped into a plurality of parallel linear patterns the same length and end positions aligned by selectively irradiating the first and second permeable holes of the permeable hole pattern with the shaped beam having a side shorter than the length of the first permeable hole in such a manner that the first permeable hole crosses such side of the beam.

BRIEF DESCRIPTION OF THE DRAWINGS

FIG. 4(a)–4(c) illustrate example wiring patterns;

FIG. 5 is a diagram indicating a block pattern required for exposing the wiring pattern of FIG. 4;

FIGS. 24(a) and 2(b) schematically illustrate a structure of a block pattern group in accordance with the present invention;

DESCRIPTION OF THE PREFERRED EMBODIMENTS

Figure 11:
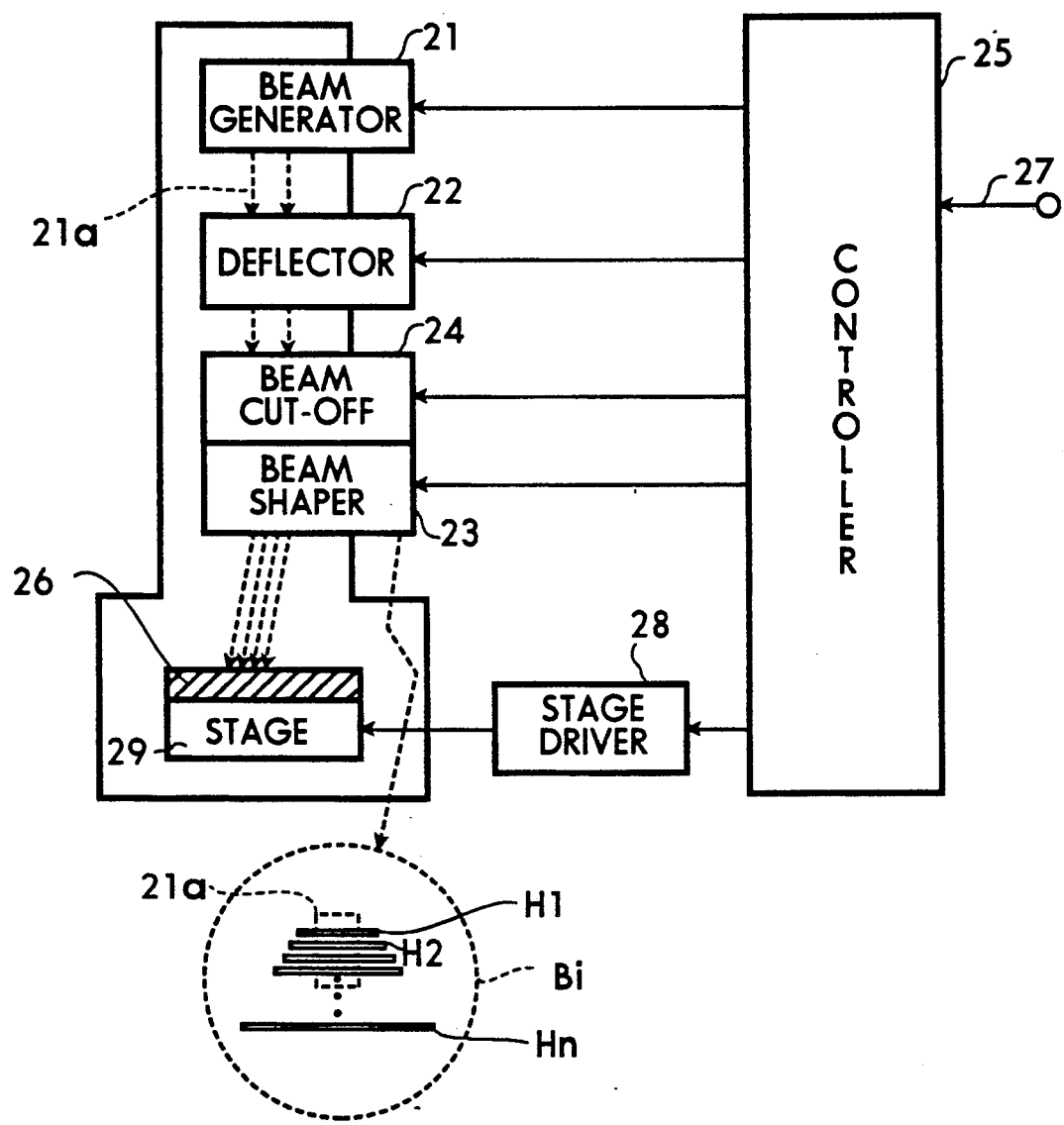
FIG. 11 is a schematic block diagram of an exposure apparatus embodying the present invention.

FIG. 11 is a schematic block diagram of an exposure apparatus in accordance with a first the embodiment of the present invention. The apparatus includes a beam shaper 23 which, together with a beam generator 21, deflector 22, beam cutoff 24 and beam shaper 23 is controlled by a controller 25. The controller 25 receives exposure data 27. An object to be exposed, 26, is positioned on a stage 29 that is controlled by a stage driver 28 in accordance with the exposure data.

Figure 12:
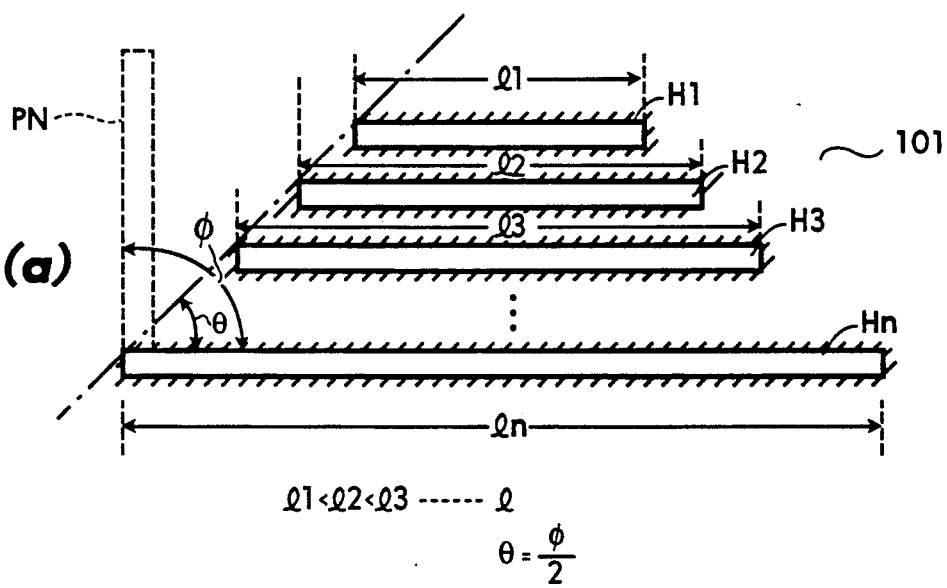
FIGS. 12(a)–12(c) illustrate a block pattern usable with the present invention.
Figure 12:
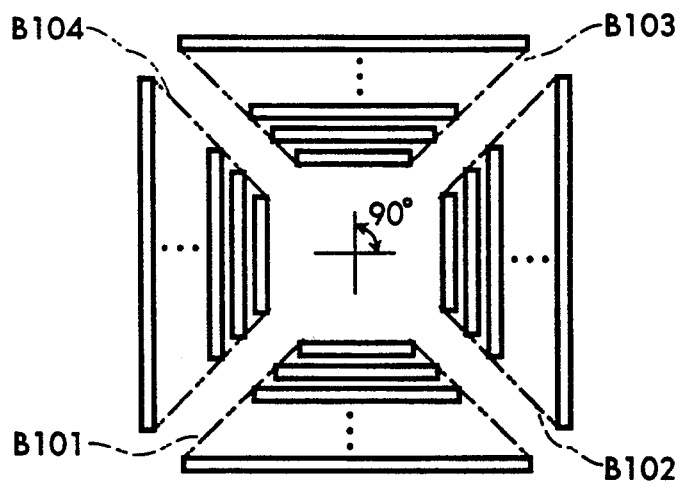
Figure 12:
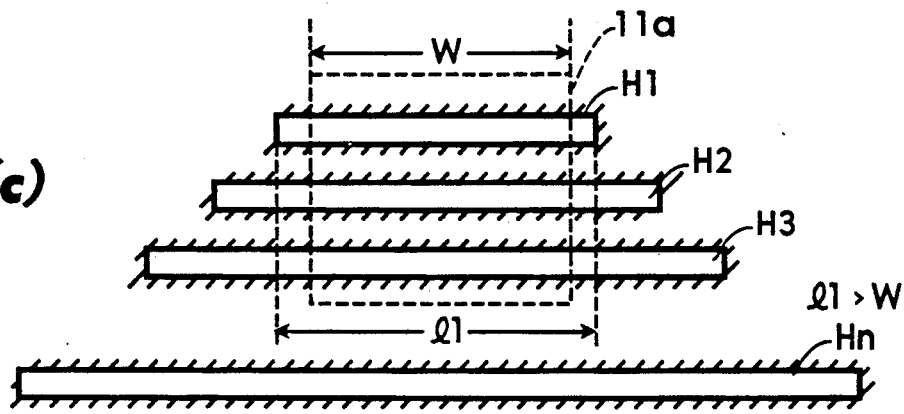

FIG. 12(b) illustrates a block pattern B101 included in the beam shaper 23. The block pattern 101 includes a plurality of beam passing sections H1, H2 ... Hn. As shown in FIGS. 12(a) and 12(b), the beam passing sections are arranged in a trapezoidal form or pyramid shape. As shown in FIG. 12(a), the beam passing sections are arranged so that an internal angle θ is set to, for example one half of a bending angle θ, additional block patterns B102, B103 and B104 are obtained by rotating the block pattern B101 by 90°, 180° and 270° respectively.

Referring to FIG. 12(a), the bending wiring pattern is created by rotating the pattern PN through an angle θ. To form this pattern, the object to be exposed 26 is placed on the stage 29. The object to be exposed 26 can comprise, for example, a wafer coated with photoresist. The object to be exposed 26 is irradiated with a rectangular shaped charged particle beam 21a as shown in FIG. 11. The rectangular charged particle beam 21a is generated by the beam generator 21 and passes through the deflector 22. As shown in FIG. 11, the charged particle beam 21a passes through the portion H1 of the first block pattern B101. The object to be exposed 26 is therefore irradiated by the deflected rectangular charged particle beam 21a.

A pattern comprising a plurality of linear patterns having a staircase outline can therefore be exposed on the object to be exposed 26. In this case, the pattern Hn shown in FIG. 12(a) is exposed on the object 26. To expose the pattern PN shown in FIG. 12(a), the first block pattern B101 is rotated 90° to obtain the second block pattern B102 as shown in FIG. 12(b). The beam cut-off 24 blocks a portion of the charge particle beam 21a that would pass through sections H1, H2 and H3. The second block pattern B102 is therefore irradiated with the rectangular shaped charged particle beam 21a so that the beam passing section Hn is irradiated. This causes the pattern PN to be exposed on the object to be exposed 26. Additional bending patterns can be formed by rotating the second block pattern B102 by 90° to obtain a third block pattern B103. A fourth block pattern B104 can be obtained by rotating the third block pattern B103 by 90°. Thus, a large variety of bending patterns such as B11-B14 of FIG. 5 and the staircase block patterns B15-B17 of FIGS. 17(a)-17(f) can easily be obtained using the block patterns shown in FIG. 12(b), and by eliminating only selected ones of the beam passing sections H1, H2 ... Hn.

FIG. 12(c) illustrates the block pattern of FIG. 12(a) with a charge particle beam 11a schematically represented as passing through the beam passing sections H1, H2 and H3. As shown in FIG. 12(c), the width W of the charge particle beam 11a is less than the width 11 of the beam passing section H1.

Figure 13:
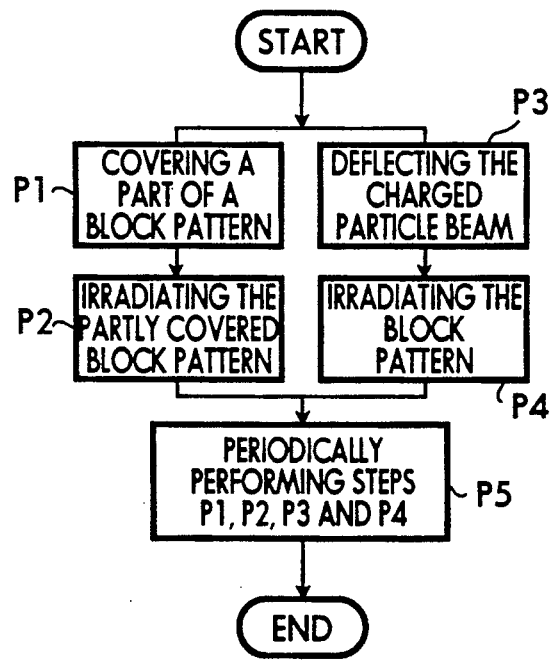
FIG. 13 is a logic flow diagram indicating the logic flow of the first embodiment of the present invention.

FIG. 13 is a logic flow diagram showing the logic flow of the first embodiment of the present invention as discussed above. In FIG. 13, step P1 comprises covering a portion of a block pattern such as block pattern B101. A step P2 includes irradiating the block pattern B101 that has been partly covered. Alternatively, step P3 includes deflecting a charged particle beam so as to irradiate one of the beam passing sections H1, H2, ... Hn. Step P4 includes irradiating the selected beam passing section. As shown in FIG. 13, step P5 includes periodically performing steps P1, P2 and P3, P4. With the present invention, using only a limited number of block patterns such as B101-B104, a large variety of wiring patterns and staircase power supply wiring patterns can be exposed in an efficient and high speed manner. Accordingly, the throughput of a charged particle exposing apparatus and the flexibility of available block patterns on a stencil mask is improved.

Figure 14:
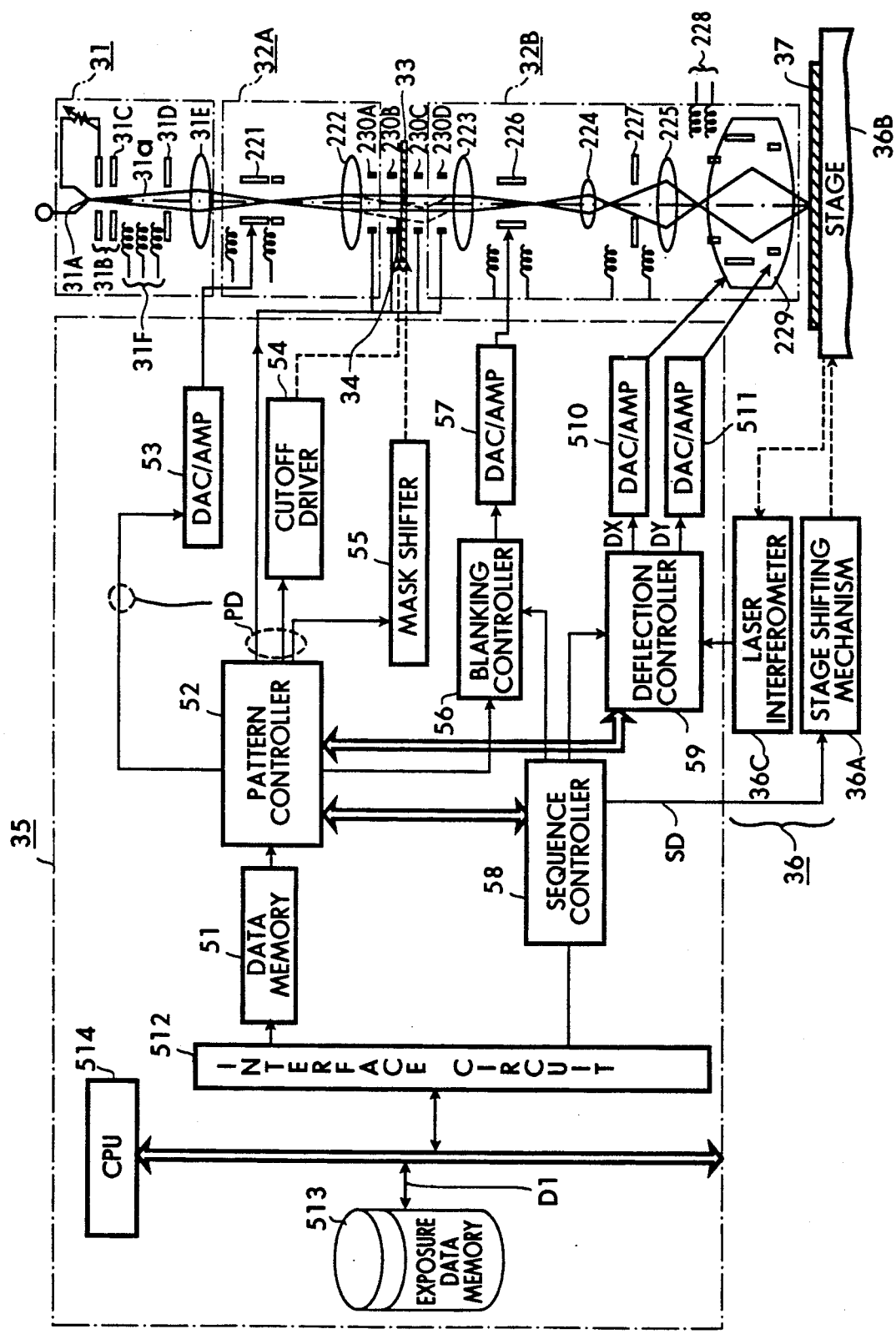
FIG. 14 is a schematic block diagram of an electron beam apparatus embodying the first embodiment of the present invention.

FIG. 14 is a schematic block diagram of an electron beam apparatus in accordance with the first embodiment of the present invention. In FIG. 14, reference numeral 31 identifies a rectangular electron beam generating system. The electron beam provided by the electron beam generating system 31 passes through a first deflection system 32A, a second deflection system 32B and a stencil mask 33. A beam cut-off device 34 can be used to block a portion of the beam that is deflected by the first deflection system 32A; and thus shape the beam into a first shape. An exposure control system 35 controls the first and second deflector systems 32A and 32B, the beam cut-off 34 and the movement of the stencil mask 33 and a stage 36B.

The rectangular electron beam generating system 31 comprises an embodiment of the beam generator 21 shown in FIG. 11. In the rectangular electron beam generating system 31, an electron gun 31A generates an electron beam that is shaped by a grid electrode 31B and an anode electrode 31C. An alignment coil 31F aligns the beam to pass through a rectangular shaping aperture 31D. The shaped beam is then focused by a first electron lens 31E. In general, the rectangular electron beam generating system 31 accelerates the electron beam 31a that is generated by the electron gun 31A and that passes through the grid electrode 31B and the anode electrode 31C. The rectangular shaped beam 31a emitted by the rectangular electron beam generating system 31 is focused to cover an adequate irradiation area by the first electron lens 31E.

The first deflection system 32A comprises an embodiment of the deflector 32 shown in FIG. 11. The first deflection system 32A aligns the rectangular electron beam 31a so that it can irradiate a desired one of the block patterns on the stencil mask 33. A slit deflector 221 provides a first amount of deflection of the electron beam 31a. This beam is then focussed by a second electron lens 222 that provides the beam to an electro-static deflector 230A that deflects the electron beam to a selected block pattern on the stencil mask 33. Another deflector 230B adjusts the verticle position of the electron beam 31a on the stencil mask 33.

In FIG. 14, the stencil mask 33 comprises an embodiment of the beam shaper 23 shown in FIG. 11. The stencil mask 33 includes, for example, block patterns B101-B104 as shown in FIG. 12(b). The stencil mask 33 can also include specialized block patterns. The stencil mask 33 also includes a rectangular opening and a positioning mark.

Figure 16:
FIGS. 16(a) and 16(b) schematically illustrate a beam cutoff mechanism of the first embodiment of the present invention.
Figure 16:
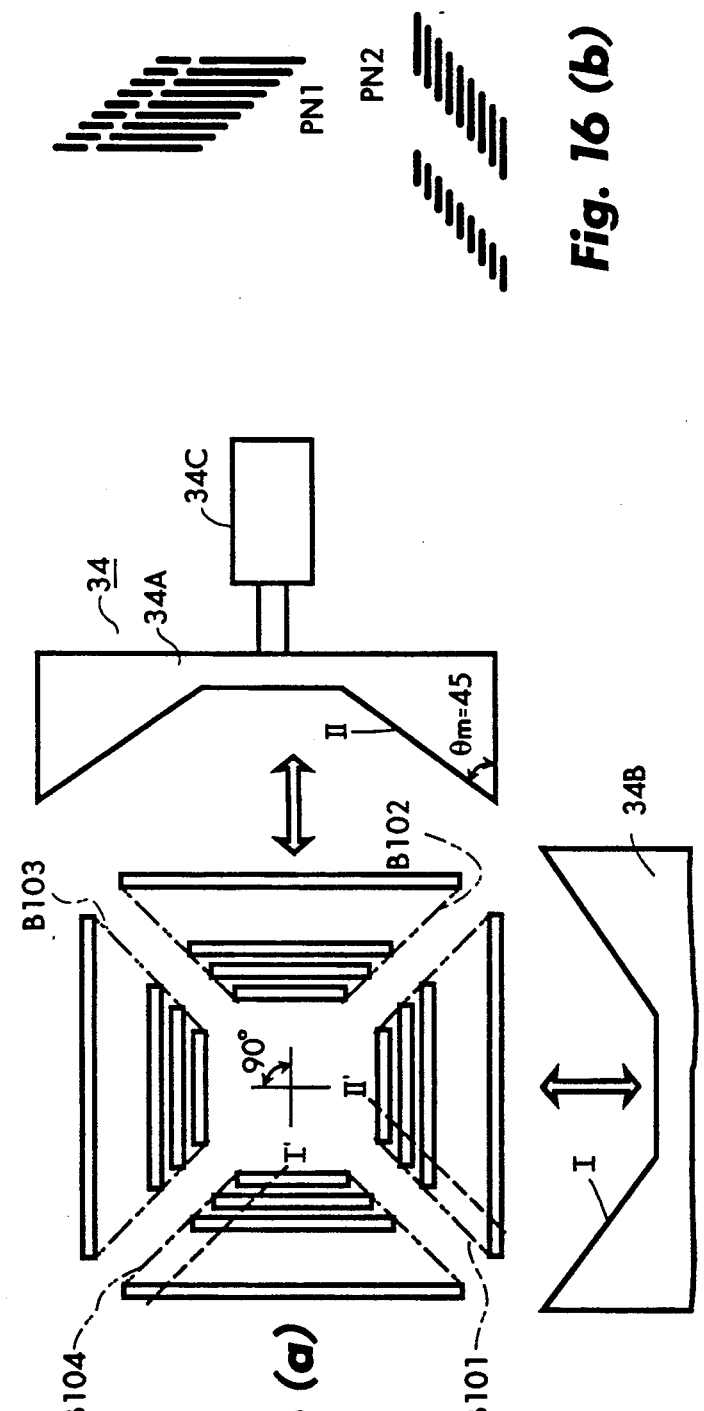

In FIG. 14, a beam cut-off 34 is an embodiment of the beam cut-off 24 shown in FIG. 11, which is an optional feature of the present invention. The beam cut-off 34 blocks portions of the electron beam 31a from reaching the stencil mask 33. Generally, the beam cut-off mechanism 34 is used when irradiating the stencil mask 33 with a parallelogram type electron beam. The beam cut-off mechanism 34 is discussed in more detail with respect to FIG. 16.

In FIG. 14, the second deflection system 32B is an embodiment of a portion of the deflector 22 shown in FIG. 11. The second deflection system 32B functions to reduce the size of the rectangular electron beam 31a that has passed through the desired block pattern on the stencil mask 33, and to deflect the electron beam 31a. A deflector 230C functions to return the electron beam 31a to the optical axis 31A. A deflector 230D adjusts the electron beam 31a so that it becomes parallel to the optic axis illustrated in FIG. 11 by a dot-line. A main deflection coil 228 and a sub-deflector 229 function to deflect the electron beam 31a to the appropriate position on the semiconductor wafer 37. The main deflection coil 228 includes an electromagnetic deflector that deflects the electron beam 31a to a predetermined position on the wafer 37, and has the capability of deflecting the electron beam 31a through a large deflection angle. The sub-deflector 229 includes an electrostatic deflector that deflects the electron beam 31a through a smaller deflection angle at a high speed. The second deflection system 32B also includes a third electron lens 223, a fourth electron lens 224 and a fifth electron lens 225.

In FIG. 14, the exposure control system 35 comprises an embodiment of the controller 25 shown in FIG. 11. In the exposure control system 35, exposure data D1 is provided by an exposure data memory 513 to a data memory 51 and a sequence controller 58. A CPU 514 controls the transfer of exposure data D1 through an interface circuit 512. A pattern controller 52 reads the exposure data stored in data memory 51 and provides data pattern PD to a digital-to-analog converter/amplifier 53, a cut-off driver 54 and a mask shifter 55. Thus, the exposure data provided by data memory 51 through the pattern controller 52 controls the slit deflector 221, beam cut-off apparatus 34 and stencil mask 33. In addition, the blanking deflector 226 is driven by and controlled by a blanking controller 56 through a digital-to-analog converter/amplifier 57 in accordance with pattern data PD provided by pattern controller 52.

The sequence controller 58 provides deflection data DD to a deflection controller 59 and to a stage shifting mechanism 36A. In addition, the deflection controller 59 provides the X-Y deflection data DX, DY through digital-to-analog converters/amplifiers 510 and 511 to the main deflection coil 228 and the sub-deflection coil 229.

As shown in FIG. 14, a stage driving system 36 drives a stage 36B. The stage shifting mechanism 36A drives the stage in accordance with stage driving data SD provided by sequence controller 58. The amount of movement of the stage 36B is detected by a laser interferometer 36C.

Figure 15:
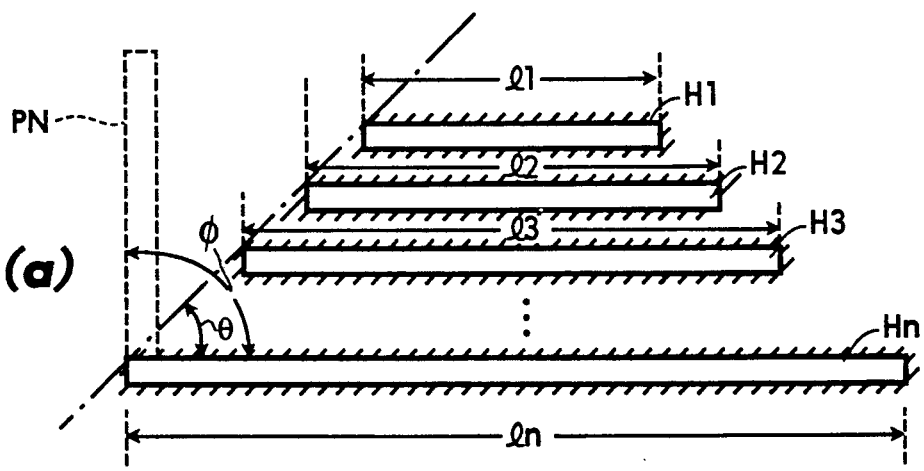
FIGS. 15(a)–15(c) illustrate another block pattern usable with the first embodiment of the present invention.
Figure 15:
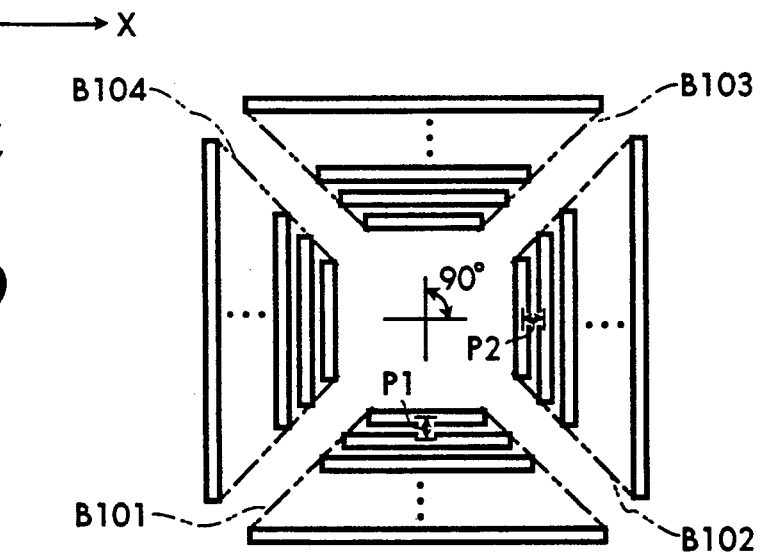
Figure 15:
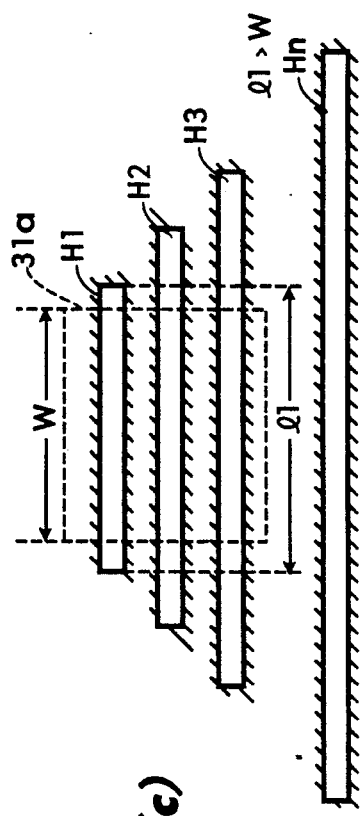

FIGS. 15(a)–15(c) illustrate another block pattern in accordance with the present invention. FIG. 15(a) is a plan view of a beam passing section of the block pattern. As in FIG. 12(a), H1, . . . Hn indicate a plurality of beam passing sections, which comprise a plurality of apertures. Each of the beam passing sections H1, . . . Hn can have a width of several $\mu$m and a length of several tens of $\mu$m. As shown in FIGS. 12(a) and 15(a), the lengths l1, l2, . . . ln are related in accordance with l1<l2< . . . ln. The beam passing sections H1 . . . Hn are arranged in a trapezoidal shape as shown in FIGS. 15(a) and 15(b). In the embodiment shown in FIG. 15(a), an internal angle $\phi$ is selected to be one half of the desired bending angle $\phi$.

FIG. 15(b) illustrates the basic shapes available by rotating the block pattern of FIG. 15(a) through 270° in 90° steps. In FIG. 15(c), the width W of the electron beam 31a is less than the length l1 of the beam passing section H1. When the maximum width $w_{max}$ of the rectangular electron beam 31a is restricted due to the deflection system, the length of the beam passing sections l1 is selected such that $w_{max}$<l1, and between the minimum length of the beam passing section H1 and the maximum width $w_{max}$.

FIGS. 16(a) and 16(b) schematically illustrate a beam cut-off mechanism. FIG. 16(a) is a plan view of the beam cut-off mechanism 34 shown in FIG. 14. The beam cut-off mechanism 34 is provided just above the four trapezoidal shaped block patterns B101–B104. The beam cut-off mechanism 34 comprises a pair of beam cut-off masks 34A and 34B. The mask angle $\phi_m$ is selected in accordance with the internal angle $\phi$ of the block mask shown in, for example, FIGS. 12(a) and 15(a). In the embodiment shown in FIGS. 15(a) and 16(a), the angles are set to 45°.

FIG. 16(b) illustrates an exposure pattern generated using a trapezoidal shaped block pattern such as shown in FIG. 15(a) and the beam cut-off mechanism 34. In FIG. 16(b), exposure patterns PN1 and PN2 respectively correspond to parallelogram shaped pattern groups generated by moving the beam cut-off masks 34A and 34B using the X fine driving mechanism 34C and the Y fine driving mechanism (not illustrated) and the trapezoidal shaped block patterns B101–B104. More particularly, the side I of the cut-off mask 34B is positioned at the line I' on block pattern B104. The block pattern B104 is then irradiated with the electron beam 31a to create the exposure pattern PN1. The exposure pattern PN2 is generated when the side II of cut-off mask 34A is positioned at line II' of block pattern B101 and subsequently irradiating the block pattern 101 with the electron beam 31a.

FIGS. 17(a)–17(f) schematically illustrate the exposure method of the first embodiment of the present invention, when utilized to form an exposure pattern such as illustrated in FIGS. 4(a)–4(c). First, the block pattern B104 is selected from the block patterns shown in FIG. 15(b). This block pattern is then irradiated with the electron beam 31a as shown in FIG. 17(a). As described with respect to FIG. 14, the electron beam 31a is controlled by the electron beam generating system 31 and the first deflection 32A. More particularly, the pattern data PD is provided by the pattern controller 52 to the DAC/AMP 53, cut-off driver 54 and mask shifter 55. With the electron beam 31a irradiating the semiconductor wafer 37 as shown in FIG. 17(a), the pattern data PD is driving the slit deflector 221; and the cut-off driver 54 moves the beam cut-off mask 34A out of the field of the block patterns B101–B104. Thus, the image of a plurality of parallel patterns PL1 having equal lengths is obtained as shown in FIG. 17(a).

Next, the image PL1 is deflected and aligned at a predetermined position on the semiconductor wafer 37 by the second deflection system 32B. The rectangular electron beam 31a reaches the semiconductor wafer in accordance with pattern data PD driving the blanking controller 56 and DAC/AMP 57. Deflection data PD provided by the sequence controller 58 drives the deflection controller 59. The deflection controller 59 provides the X, Y deflection data DX, DY so that the main deflection coil 28 and the sub-deflection 29 deflect the electron beam 31a so as to extend the pattern PL1 and form the pattern PL2. As shown in FIG. 17(b), the pattern PL2 comprises two adjacent patterns PL1 formed on the semiconductor wafer 37 as schematically shown in the left hand portion of FIG. 17(b).

Next, the electron beam 31a is positioned on the block pattern B104 as shown in FIG. 17(c). The pattern controller 52 provides pattern data PD to the DAC-/AMP 53 that controls the slit deflector 221 and to the mask shifter 55. The slit deflector 221 moves the rectangular beam 31a to the position shown in FIG. 17(a), and the stencil mask is moved to align the pattern to form exposure pattern PC1 shown in FIG. 17(c). Thus, a staircase shaped exposure pattern is formed.

Next, the second block pattern B103 on the stencil mask 33 is selected and irradiated with the electron beam 31a as shown in FIG. 17(d). The pattern controller 52 provides the pattern data PD to the DAC/AMP 53 to deflect the electron beam 31a as shown in FIG. 17(d). The pattern controller 52 drives the cut-off driver 54 to move the partial beam cut-off mask 34A to the position shown in FIG. 17(d). The resulting pattern PC2 is aligned on the semiconductor wafer 37 via the second deflection system 32B to connect to the exposure pattern PC1 as shown in FIG. 17(d).

Next, the block pattern B102 is selected and the electron beam 31a is aligned on the block pattern B102 as shown in FIG. 17(e). To effect this, the pattern controller 52 provides pattern data PD to the DAC/AMP 53 that drives the slit deflector 221. The pattern controller 52 also drives the mask shifter 55 and select the block pattern B102. The selected pattern is then positioned on the semiconductor wafer 37 by the second deflection system 32D so that the exposure pattern PC3 connects to the exposure PC2 as shown in FIG. 17(e).

Finally, the block pattern B102 is irradiated with the electron beam 31a via the second deflection system 32B as shown in FIG. 17(f). The sequence controller 58 provides deflection data DD to the deflection controller 59. The deflection controller 59 drives DAC/AMP 510 and DAC/AMP 511 with deflection data DX, DY respectively. The electron beam 31a is then deflected from the position shown in FIG. 17(e) to the position shown in FIG. 17(f). As a result, the exposure pattern PL3 is formed continuous with the exposure pattern PC3. To increase the exposure speed and throughput, exposure patterns utilizing the same block pattern (e.g., B104) can be sequentially formed using the second deflection system 32B. Once each of the patterns utilizing the same block pattern is formed, the next block pattern can be selected and the exposure pattern formed. In the embodiment illustrated in FIGS. 17(a)–17(f), the first irradiating process would comprise the pattern shown in FIG. 17(d) since this pattern required selection of a special block pattern and movement of the partial cut-off mask 34A. With the method illustrated in FIGS. 17(a)–17(f), it is possible to create wiring patterns efficiently and quickly using only four types of block patterns such as B101–B104. Thus, the throughput of an electron beam exposure apparatus and the flexibility of a stencil mask is significantly improved.

Figure 6A:
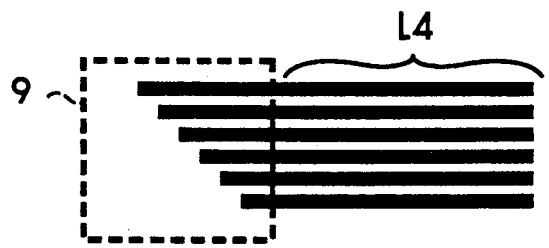
FIG. 6(a) and FIG. 6(b) illustrate an example of a staircase power supply wiring pattern.
Figure 6B:
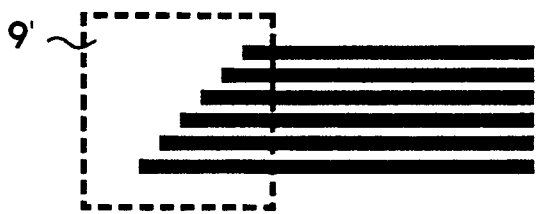
Figure 7:
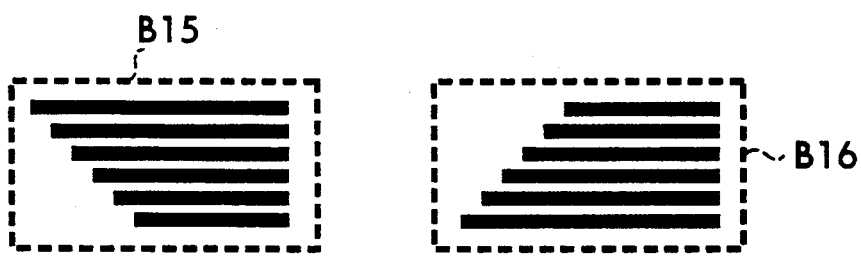
FIG. 7 is a diagram indicating a block pattern required for exposing the staircase power supply wiring pattern of FIG. 6.
Figure 8:
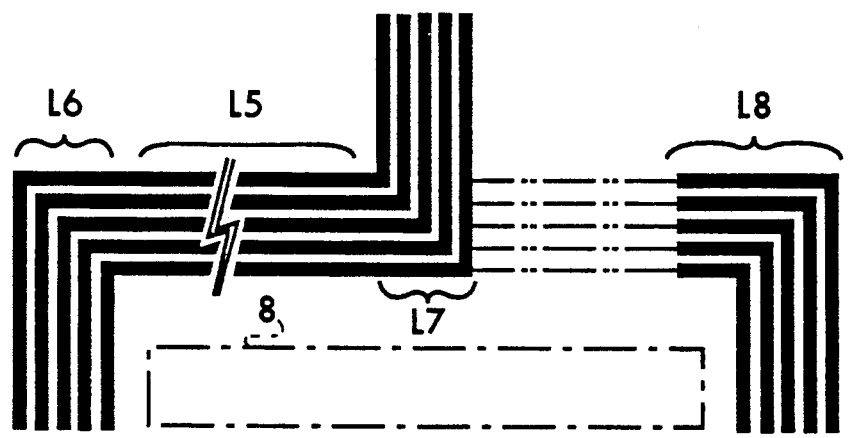
FIG. 8 is a diagram indicating another example of a wiring pattern.
Figure 9:
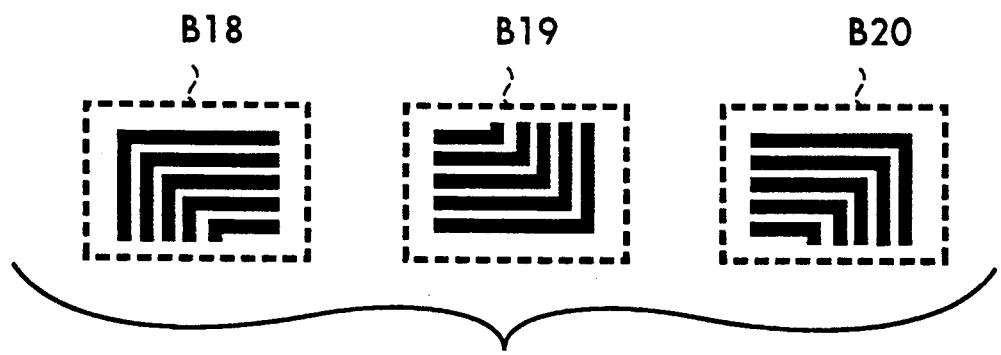
FIG. 9 is a diagram indicating a block pattern required for exposing the wiring pattern of FIG. 8.
Figure 10:
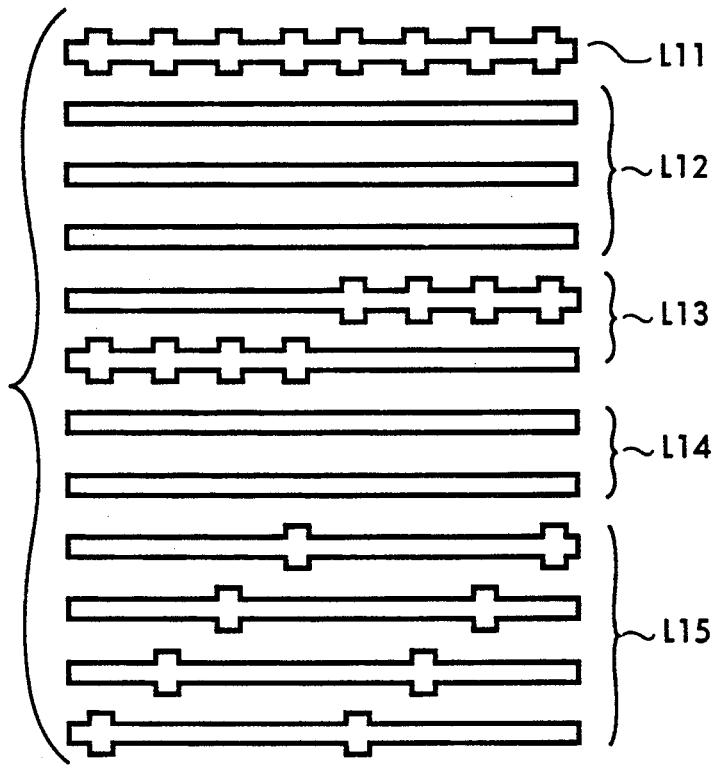
FIG. 10(a) and FIG. 10(b) illustrate an example of a wiring pattern having contact holes and a block pattern required for exposing the such wiring pattern, respectively.
Figure 10:
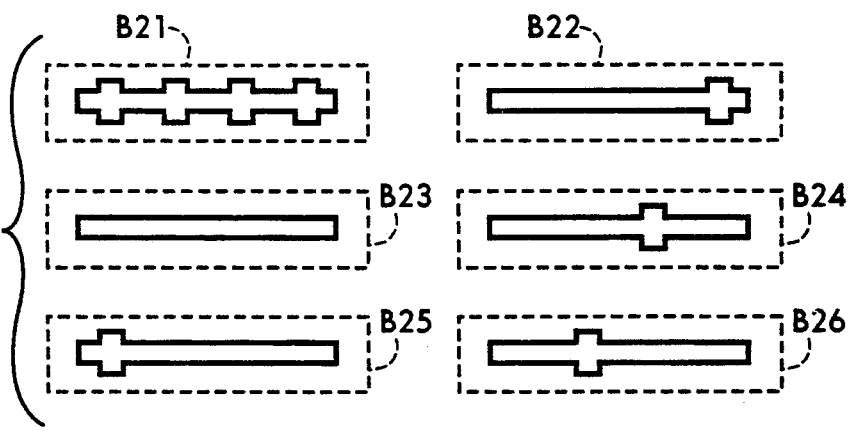
Figure 18:
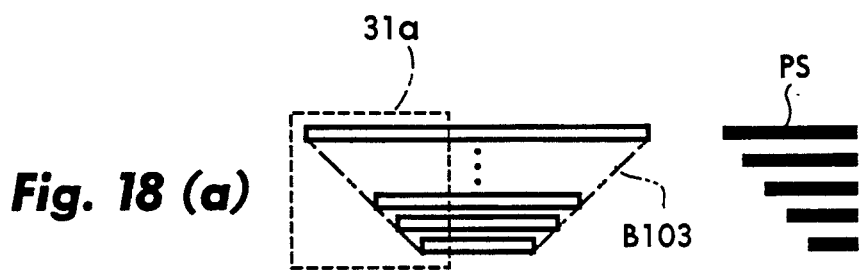
FIGS. 18(a)–18(c) schematically illustrate the exposure method of the present invention for a staircase power supply wiring pattern.
Figure 18:
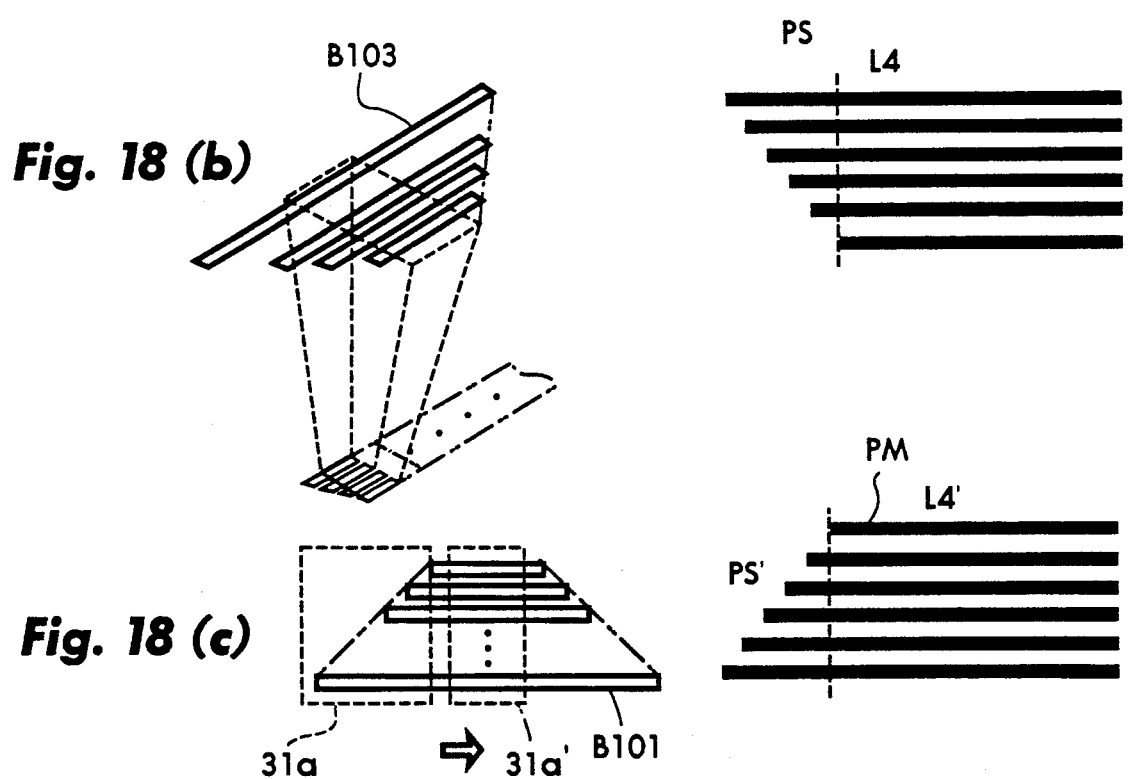
Figure 18:
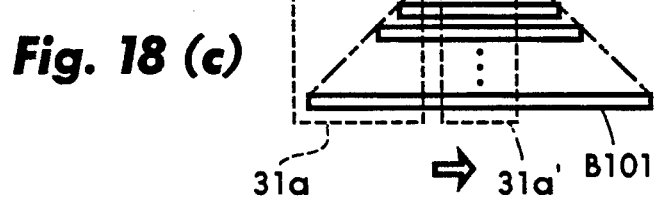

FIGS. 18(a)–18(c) schematically illustrate the exposure method of the present invention for a staircase power supply wiring. FIGS. 18(a)–18(c) illustrate the positional relationships between the block patterns B101, B103 and the electron beam 31a, and the positional relationship between the beam passing through the respective block patterns and the semiconductor wafer 37. To form the staircase power supply wiring patterns shown in FIGS. 6(a) and 6(b), the pattern controller 52 drives the DAC/AMP 53, cut-off driver 54 and mask shifter 55 with pattern data from the exposure data stored in data memory 51. The block pattern B103 is selected and the electron beam 31a positioned on the block pattern B103 as shown in FIG. 18(a). The resultant pattern is then positioned on the semiconductor wafer 37 via the second deflector system 32B. The cut-off driver 54 moves the beam cut-off mechanism 34 outside the field of the block patterns B101–B104. In this situation, the pattern controller 52 drives the blanking controller 56 to move the electron beam 31 along the block pattern 103 and the semiconductor wafer 37 via blanking deflector 226. The sequence controller 58 provides deflection data DD to the deflection controller 59. The deflection controller 59 drives the DAC/AMPs 510 and 511 with X, Y deflection data DX, DY respectively. Thus, the staircase power supply wiring pattern PS is positioned and formed on the semiconductor wafer 37 at the desired location via the main deflection coil 228 and sub-deflector 229.

The block pattern B103 is then irradiated by the electron beam 3a as shown in FIG. 18(b). To effect this, the pattern controller 52 provides pattern data PD to the DAC/AMP 53 and mask shifter 55. Thus, the slit deflector 221 deflects the electron beam 31a to a desired position on the stencil mask 33 positioned by the mask shifter 55. Thus, the exposure pattern L4 is formed on the semiconductor wafer 37 as shown in FIG. 18(b). The exposure pattern L4 can be made any desired length through a combination of deflecting the electron beam 31a via the second deflector system 31B and moving the semiconductor wafer 37 via the stage 36B.

FIG. 18(c) illustrates a staircase power supply wiring pattern that is the mirror image of the staircase wiring pattern shown in FIG. 18(b). This wiring pattern is exposed in the manner similar described with respect to FIGS. 18(a) and 18(b) using the block pattern B101. In this case, the pattern controller 52 drives the DAC/AMP 53, cut-off driver 54 and mask shifter 55 with pattern data PD. Thus, the slit deflector 221, the stencil mask 33 and the cut-off mechanism are respectively driven and controlled. The partial beam cut-off masks 34A and 34B are moved outside the field of the block patterns B101–B104. Thus, in accordance with the process schematically illustrated via FIGS. 18(a)–18(c), the power supply wiring pattern shown in FIGS. 6(a)–6(c) can be exposed quickly using two block patterns B101 and B103 selected from the four types of block patterns B101–B104. The throughput and block exposure function of the electron beam exposure is therefore significantly improved.

FIGS. 19(a)–19(h) schematically illustrate a variation of the exposure method of the first embodiment of the present invention. These figures indicate the positional relationships between the block patterns B101–B104 and the electron beam 31a; and the positional relationship between the electron beam passing through the block patterns and the semiconductor wafer 37. A difference between the method illustrated in FIGS. 19(a)–19(h) and the method illustrated in FIGS. 17(a)–17(f) is that the exposure pattern in FIGS. 19(a)–19(h) is longer and avoids a larger obstruction than the exposure pattern provided by the method of FIGS. 17(a)–17(f). The method steps associated with FIGS. 19(a)–19(c) correspond to the process explained with reference to FIGS. 17(a)–17(c). This explanation is therefore not repeated. Referring to FIG. 19(d), the block pattern B103 is selected and irradiated with the electron beam 31a. To accomplish this, the pattern controller 52 utilizes the exposure data stored in data memory 51 to provide the pattern data PD to the DAC/AMP 53, cut-off driver 54, mask shifter 55 and blanking controller 56. In this case, the slit deflector 221 and stencil mask 33 are controlled so that the block pattern B103 is irradiated by the electron beam 31a to form the exposure pattern PC4 that is contiguous with the exposure pattern PC1 as shown in FIG. 19(d).

Referring to FIG. 19(e), the exposure pattern PL4 is formed by irradiating the block pattern B103 with the electron beam 31a. The resultant beam is then deflected by the second deflection system 32B to form the exposure pattern PL4. That is contiguous with the pattern PC4.

Referring to FIG. 19(f), the first portion of a 90° turn exposure pattern, PC5 is to be formed. The electron beam 31a is aligned with respect to the block pattern B103 as shown in FIG. 19(f). The first deflection system 32A positions the electron beam 31a on the block pattern B103 as shown in FIG. 19(f). The exposure pattern PC5 is contiguous with the exposure pattern PL4 as shown in FIG. 19(f).

Next, the block pattern B102 is selected and the electron beam 31a is aligned with respect to the block pattern B102 as shown in FIG. 19(g). The exposure pattern PC6 shown in FIG. 19(g) is positioned on the semiconductor wafer 37 via the second deflection system 32B and/or movement of the stage 36B. As shown in FIG. 19(g), the exposure pattern PC6 is connected to and contiguous with the exposure pattern PC5; thus, completing a 90° turn.

Referring to FIG. 19(h), the electron beam 31a is aligned to a central portion of the block pattern B102. By deflecting the electron beam 31a passing through the central portion of the block mask B102, via the second deflection system 32B, the exposure pattern PL5 is formed on the semiconductor wafer 37. As with the above exposure patterns, the second deflection system 32B adjusts the size of the exposure pattern PL5 and deflects the beam to form the exposure pattern PL5 on the semiconductor wafer 37. Thus, wiring pattern shown in FIG. 19(h) is exposed efficiently and with a high speed using only four block patterns B101–B104. The throughput of the block exposure function of electron beam exposure apparatus is therefore improved.

In the first embodiment of the present invention, one block pattern of the four block patterns B101–B104 is selected. If, however, it is possible to control the rotation of a single block pattern via the mask shifter 55, then it is not necessary to have four block B101–B104 on the stencil mask 33. Instead, only one block pattern, such as B101 is needed to be formed on the stencil mask 33. In addition, the beam passing sections H1, H2 ... Hn need not be formed in a trapezoidal shape. Instead, the cut-off mechanism can be used to form a desired staircase pattern.

Referring to FIG. 15(b), the wiring pitch P1 of the block patterns B101 and B103 for exposing wiring patterns in an X direction is equal to the wiring pitch P2 of the block patterns B102 and B104 for exposing wiring patterns in the Y direction. These pitches, however, do not need to be equal. For instance, the block patterns could be formed to satisfy the relationship $2P_1 = P_2$. The internal angle $\phi$ of the block patterns B101 and B103 would be set to $\phi = \tan^{-1}(\frac{1}{2})$, and the internal angle $\phi$ of block patterns B102 and B104 would be set to $\phi = \tan^{-1}2$.

Figure 17:
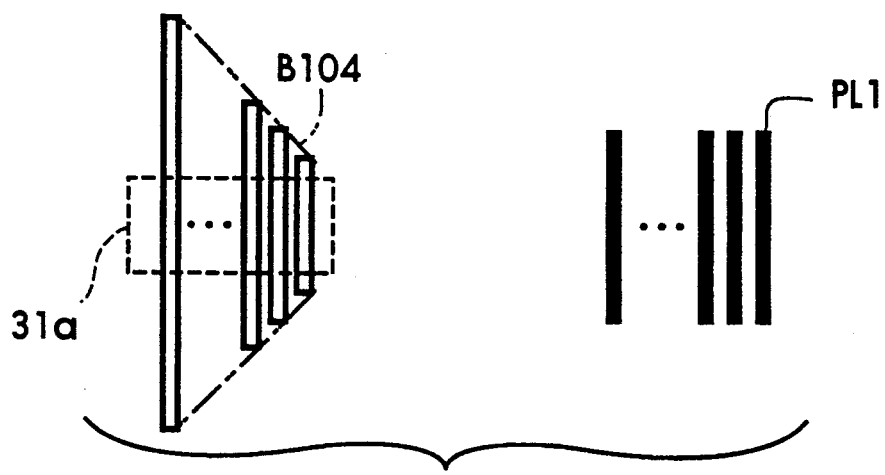
FIGS. 17(a)–17(f) schematically illustrate the exposure method of the first embodiment of the present invention.
Figure 17:
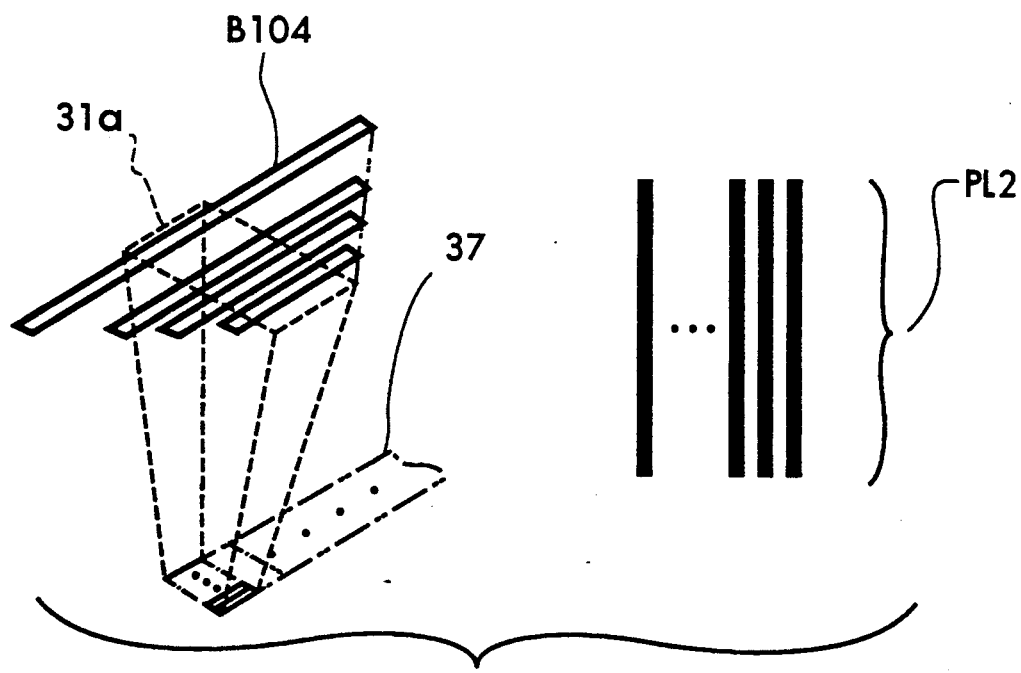
Figure 17:
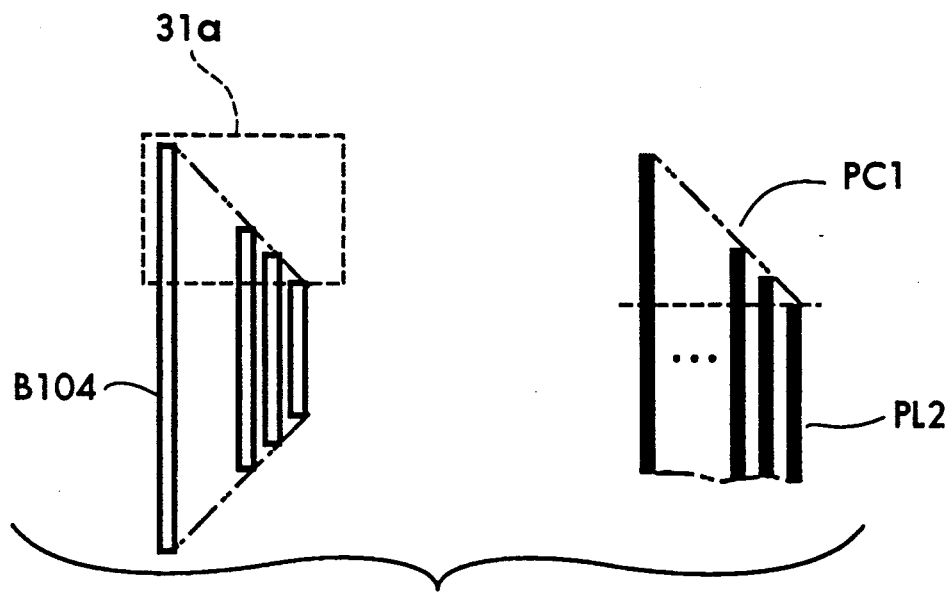
Figure 17:
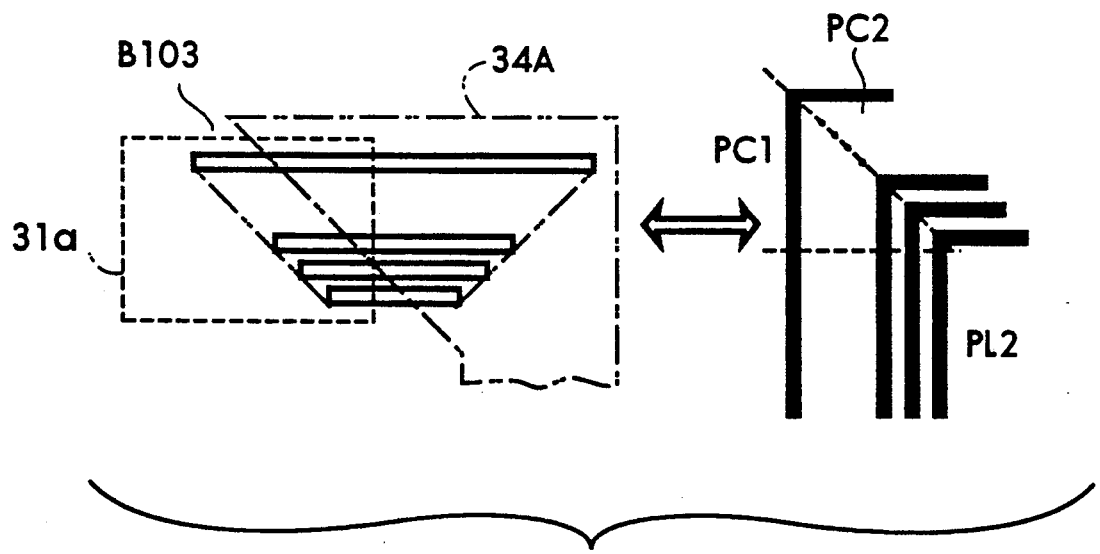
Figure 17:
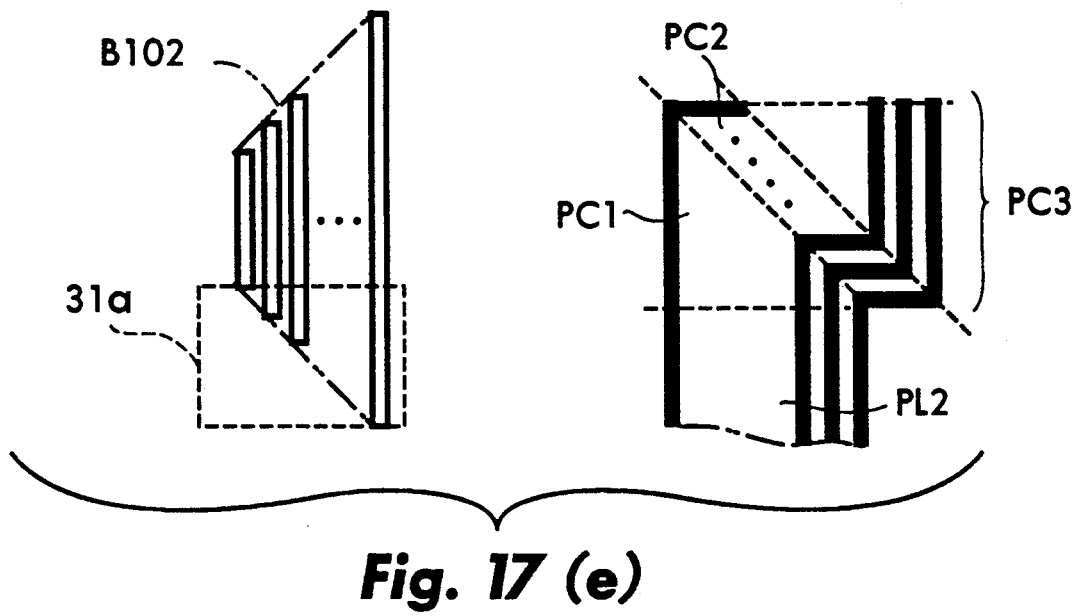
Figure 17:
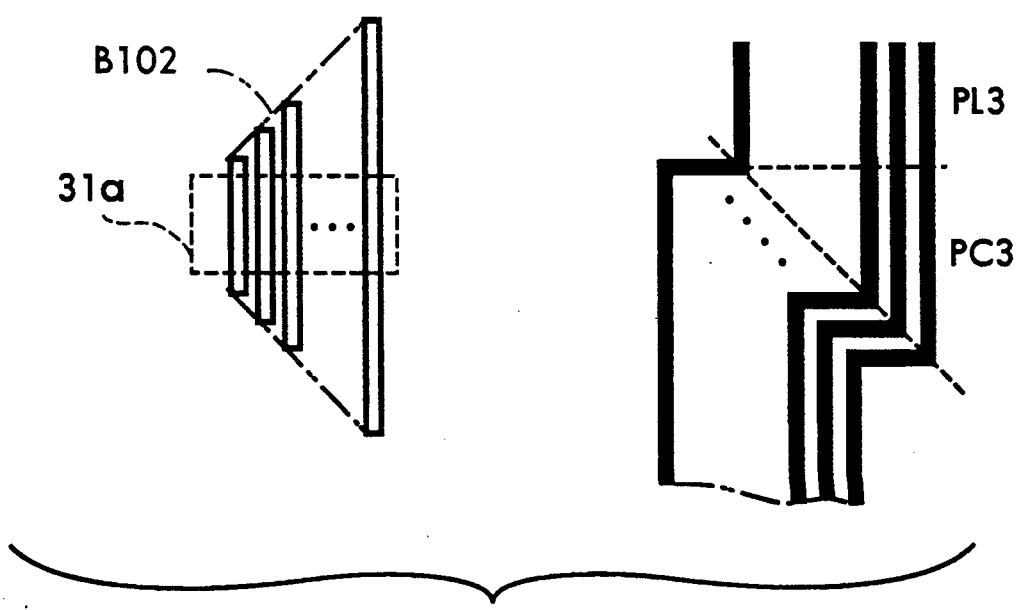
Figure 19:
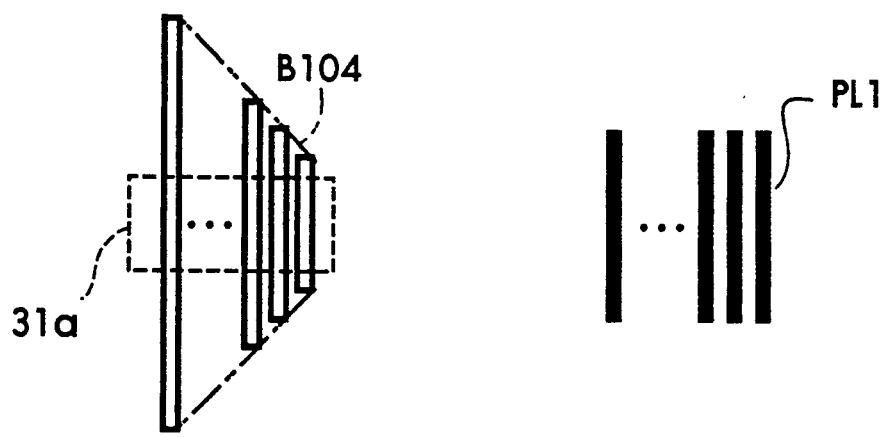
FIGS. 19(a)–19(h) schematically illustrate a variation of the exposure method of the first embodiment of the present invention.
Figure 19:
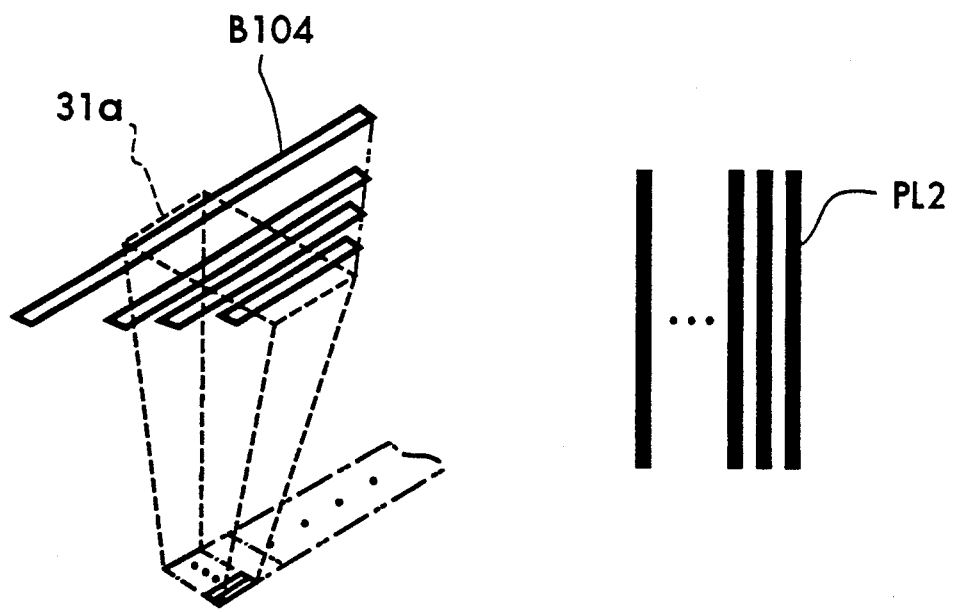
Figure 19:
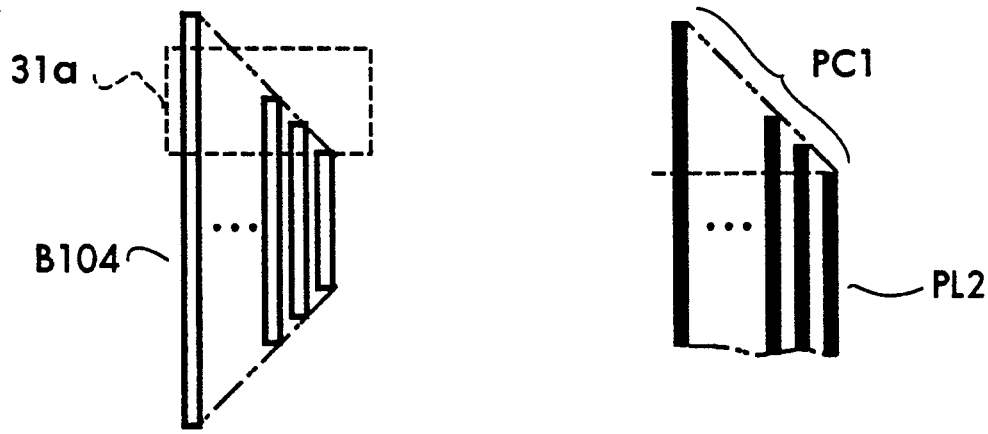
Figure 19:
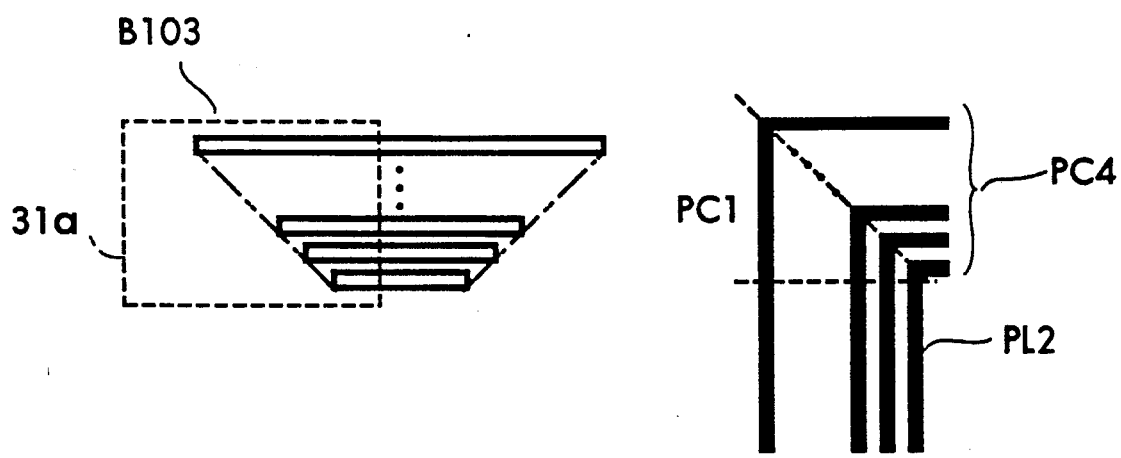
Figure 19:
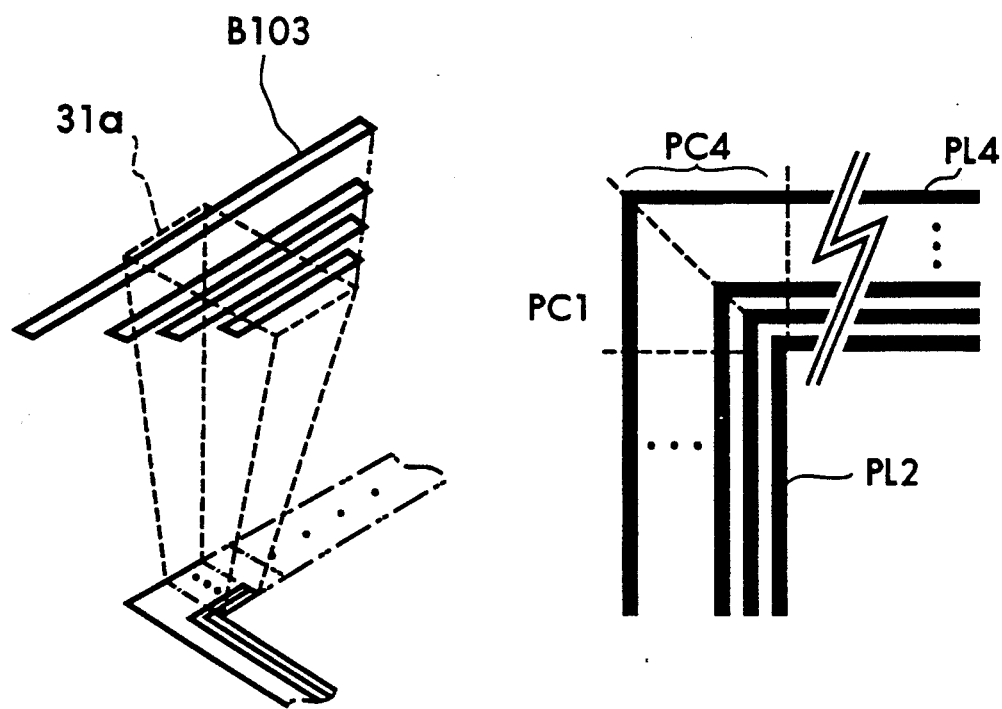
Figure 19:
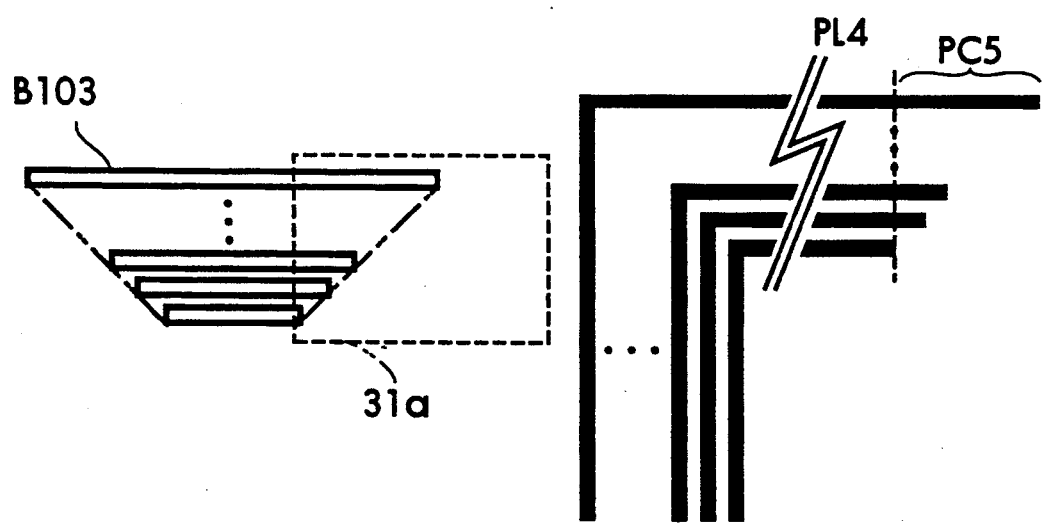
Figure 19:
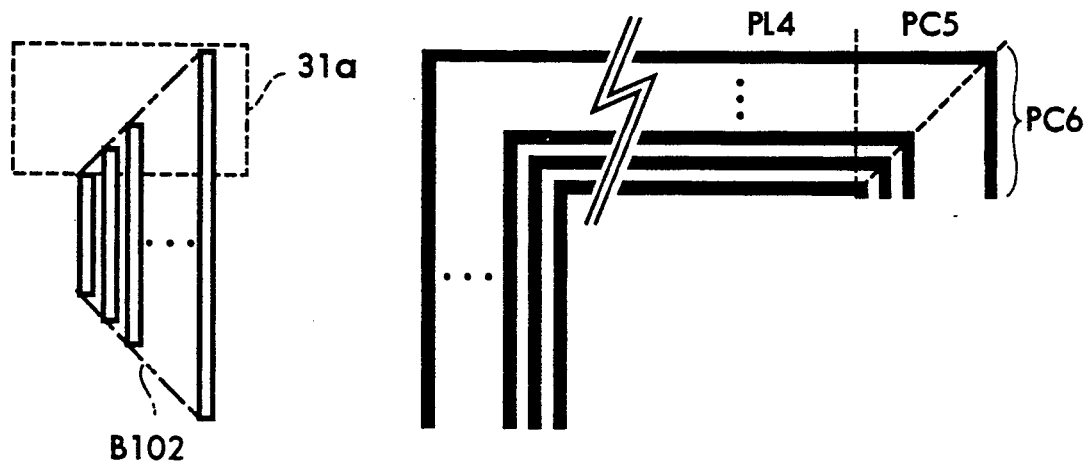
Figure 19:
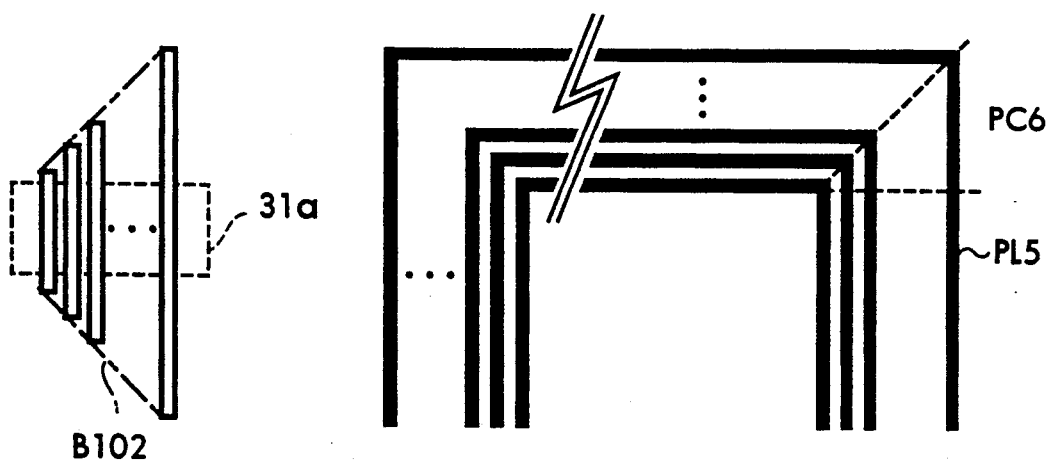

In the above examples With respect to FIGS. 17 and 19, all of the beam passing sections H1, ... Hn are irradiated with the electron beam 31a. It is possible, for example, to control the irradiation so that only the beam pattern sections H1, H2 and H3 are irradiated with the electron beam 31a. Thus, if the number of parallel wirings is changed, the exposure patterns can be formed using the available block patterns B101–B104. This significantly enhances the utility of the block patterns and the flexibility exposure system.

As shown in FIG. 15(a), the block patterns have a trapezoidal shape. The block patterns can have other shapes such as a staircase pattern at one end and all of the beam passing sections H1, H2, ... Hn arranged along the same verticle line perpendicular to the beam passing section Hn. The block pattern would then have a shape corresponding to the pattern shown in FIGS. 18(b) and 18(c).

Figure 20:
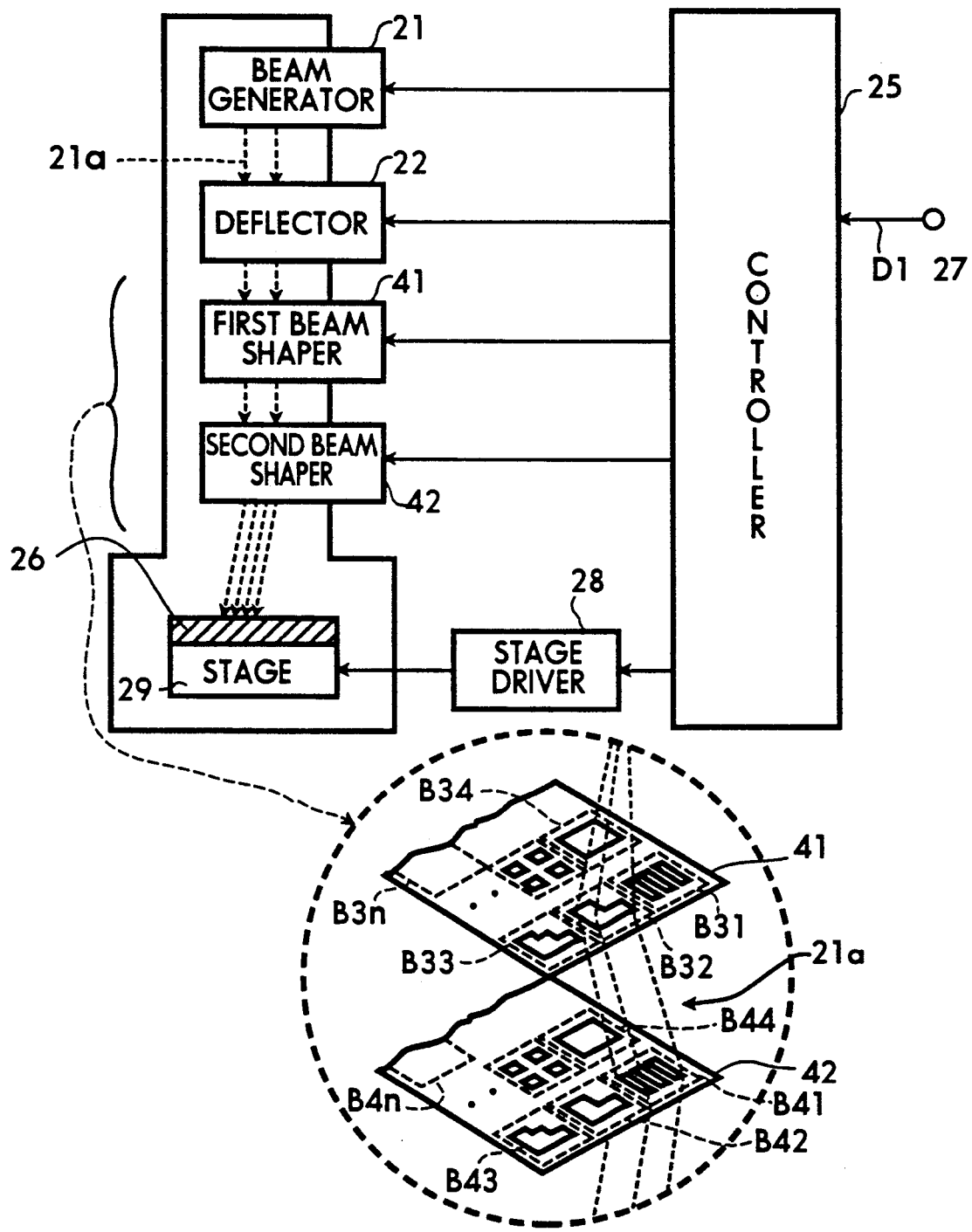
FIG. 20 is a schematic diagram according to a second embodiment of the present invention.

FIG. 20 is a schematic diagram of an exposure apparatus according to a second embodiment of the present invention. Comparing the embodiment of FIG. 11 and the embodiment shown in FIG. 20, it is seen that the second embodiment includes first and second beam shapers 41 and 42. Referring to FIG. 20, the first beam shaper 41 includes a plurality of block patterns B31, B32 ... B3n that are illuminated by the charged partial beam 21a. The second beam shaper 42 includes a plurality of block patterns B41, B42 ... B4n that are illuminated with the charged particle beam 21 after it passes through the first beam shaper 41.

Thus, by selecting and aligning various ones of the block patterns B3i and B4i, a large number of exposure patterns can be created. For example, by aligning the block pattern B31 and the block pattern B43, a staircase exposure pattern similar to PC1 shown in FIG. 17(c) can be formed. The individual block patterns of the first beam shaper 41 and the second beam shaper 42 are selected by the controller 25 in accordance with the exposure data D1. Thus, with the block patterns B3i and B4i selected, the charged particle beam 21a is deflected by deflector 22 onto the selected block patterns.

In accordance with the second embodiment of the present invention, a large number of exposure patterns can be created by aligning the first and second beam shapers 41, and 42 in the desired orientation with respect to each other. In this manner, the block patterns B3i and B4i can modify each other, or can be the same such as the block patterns B34 and B44. The resulting exposure patterns are therefore not limited to the number of block patterns on either one of the first and second beam shapers 41 and 42. Instead, the number of exposure patterns depends upon the number of block patterns together with the alignment of the first and second beam shapers 41 and 42 with respect to each other. This flexibility enables the design of an integrated circuit to be changed without requiring block patterns to be changed accordingly.

Figure 21:
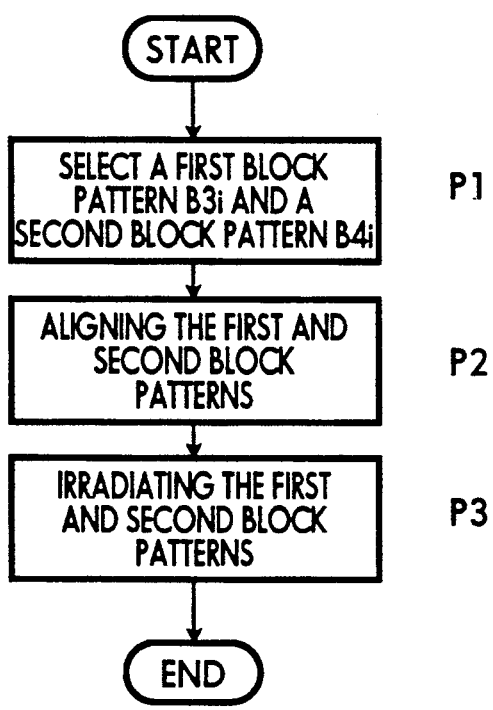
FIG. 21 is a flowchart illustrating the logic flow of the second embodiment of the present invention.

FIG. 21 is a flowchart illustrating the logic flow of the second embodiment of the present invention. In FIG. 21, a first step P1 includes selecting one of the block patterns B3i and B4i. In accordance with the exposure data D1. The step P2 aligns the first and second beam shapers 40 and 42. Step P3 comprises irradiating the selected block patterns B3i and B4i with the charged particle beam 21a, and deflecting and reducing the resulting shape charged particle beam on to the object to be exposed 26 shown in FIG. 20.

Figure 1:
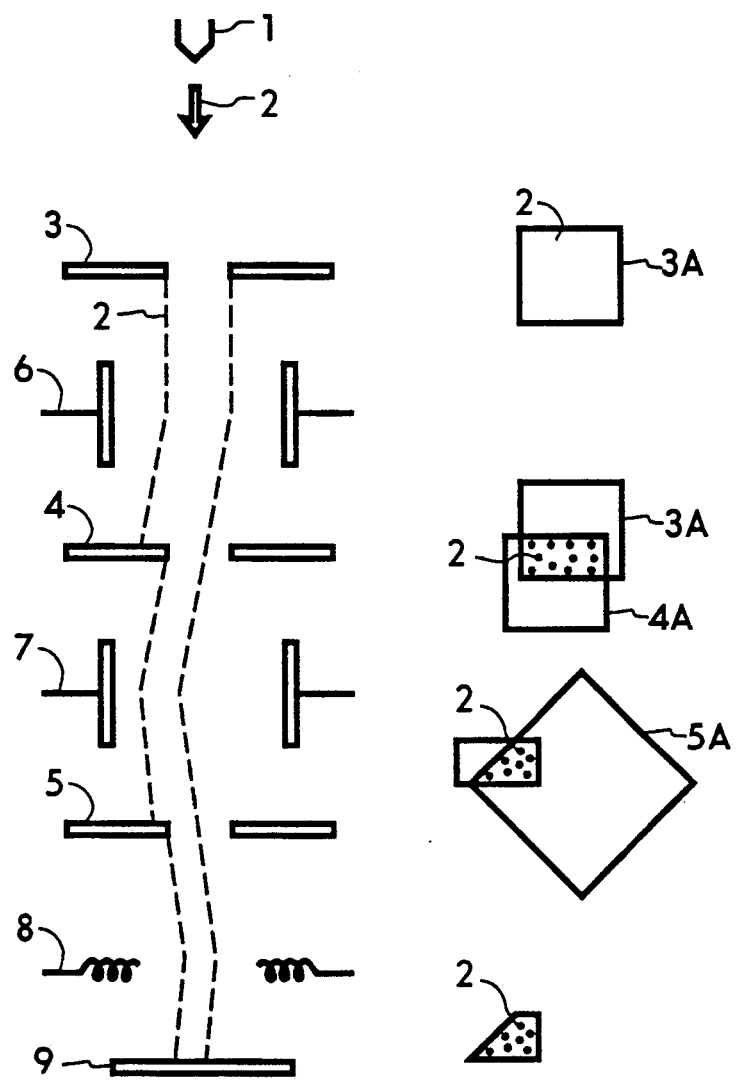
FIG. 1 is a schematic diagram of a conventional electron beam exposing apparatus.
Figure 2:
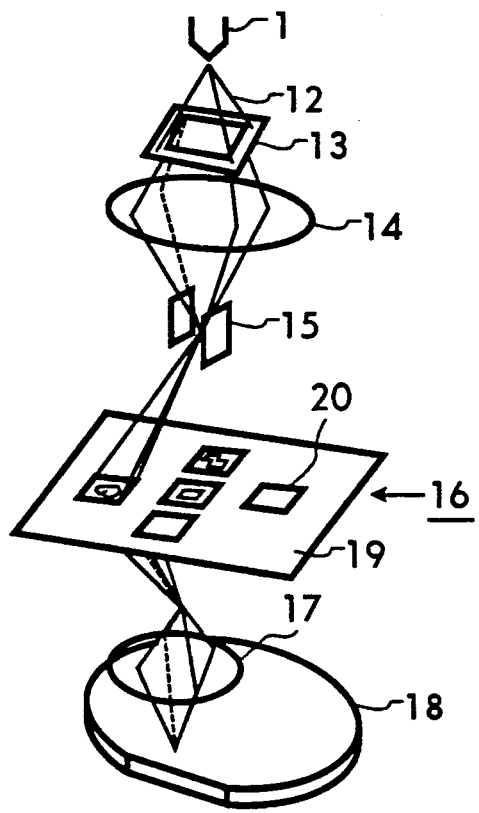
FIG. 2 is a schematic diagram of another conventional electron beam exposing apparatus.
Figure 22:
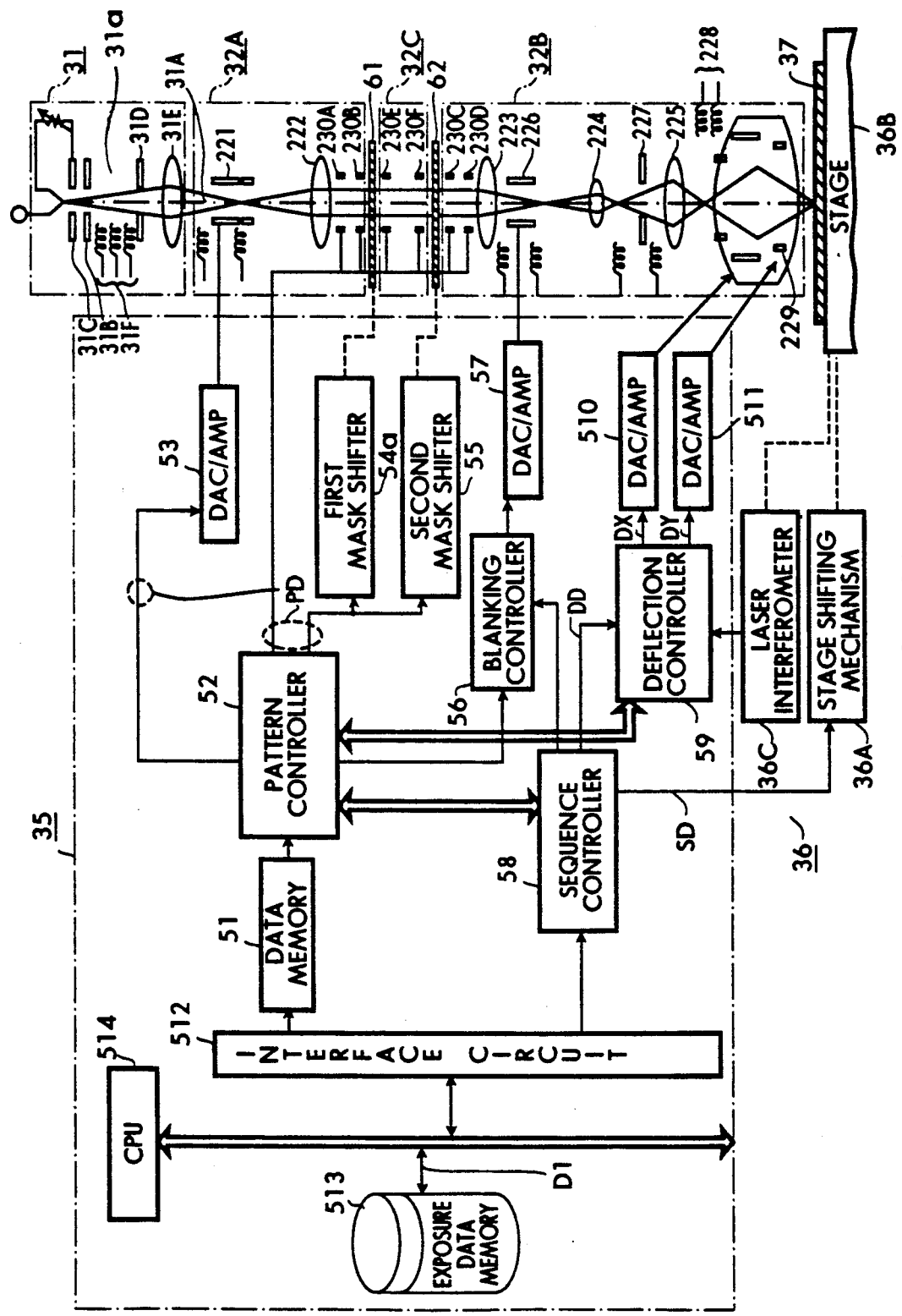
FIG. 22 is a schematic diagram of an another exposure method according to embodiment the present invention.

FIG. 22 is a schematic diagram of an exposure apparatus according to the second embodiment of the present invention. In FIG. 2, elements having the same function as those in FIG. 14 are identified with the same reference numerals. There are, several differences in the FIG. 22 system. For example, the FIG. 22 system includes first and second stencil masks 61 and 62 that respectively correspond to the first and second beam shapers 41 and 42 shown in FIG. 20. The FIG. 22 system also includes a third deflection system 32C and first and second mask shifters 54a and 55. The third deflection system 32C functions to deflect the electron beam 31a onto the appropriate block pattern of the second stencil mask 62 (i.e., the second beam shaper 42).

Figure 23:
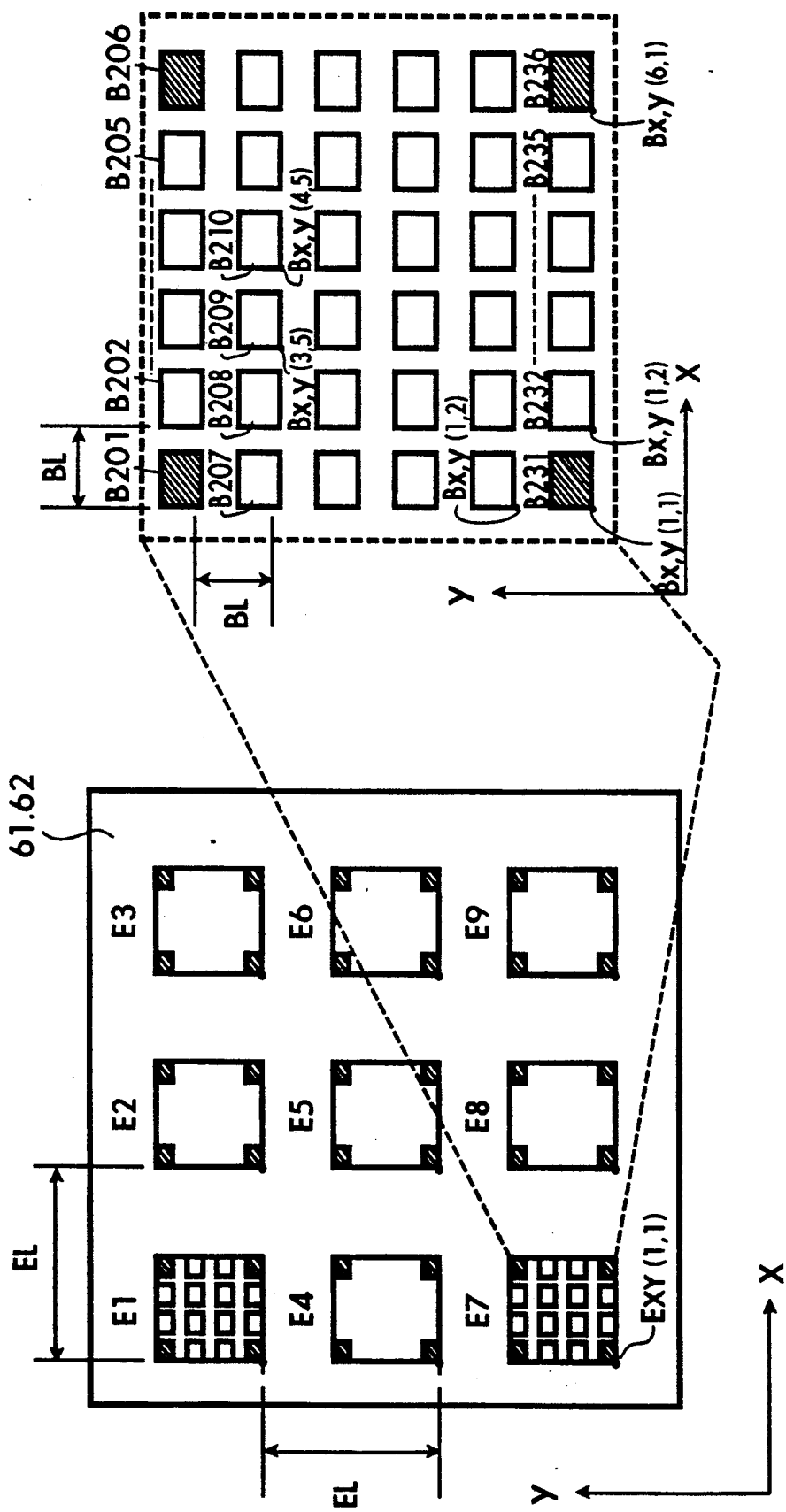
FIGS. 23(a) and 23(b) schematically illustrate a structure of a stencil mask in accordance with the present invention.

FIGS. 23(a) and 23(b) schematically illustrate a structure of a stencil mask in accordance with the second embodiment of the present invention. FIG. 23(a) illustrates a layout applicable to either the first or second stencil mask 61, 62 (i.e., the first and second beam shapers 41 and 42). FIG. 23(b) is an enlargement of one of the irradiation areas shown on the stencil mask of FIG. 23(a). In an embodiment of the present invention, each of the irradiation areas E1-E9 occupies approximately 1-5 mm$^2$, corresponding to the maximum deflection range of the electron beam 31a. The designation $E_{xy}$ indicates the coordinates of a reference point of each of the irradiation areas E1-E9. For example, the designation $E_{xy}$ (1, 2) of the irradiation area E7 indicates the reference coordinates of the irradiation area E7.

The designations B201-B236 indicate a plurality of block patterns formed within the irradiation area E7. These areas are arranged in a matrix form having a known pitch interval BL. In one embodiment of the present invention, thirty six block patterns are provided in one irradiation area and arranged in a 6×6 matrix. Each block pattern occupies approximately 100-500 μm$^2$. This is approximately equal to the irradiation area of the electron beam 31a. The designation $B_{xy}$ indicates the coordinates of a reference point for each of the block patterns. For example, the reference point of the block pattern B32 is designated as $B_{xy}(1, 2)$.

Figure 24:
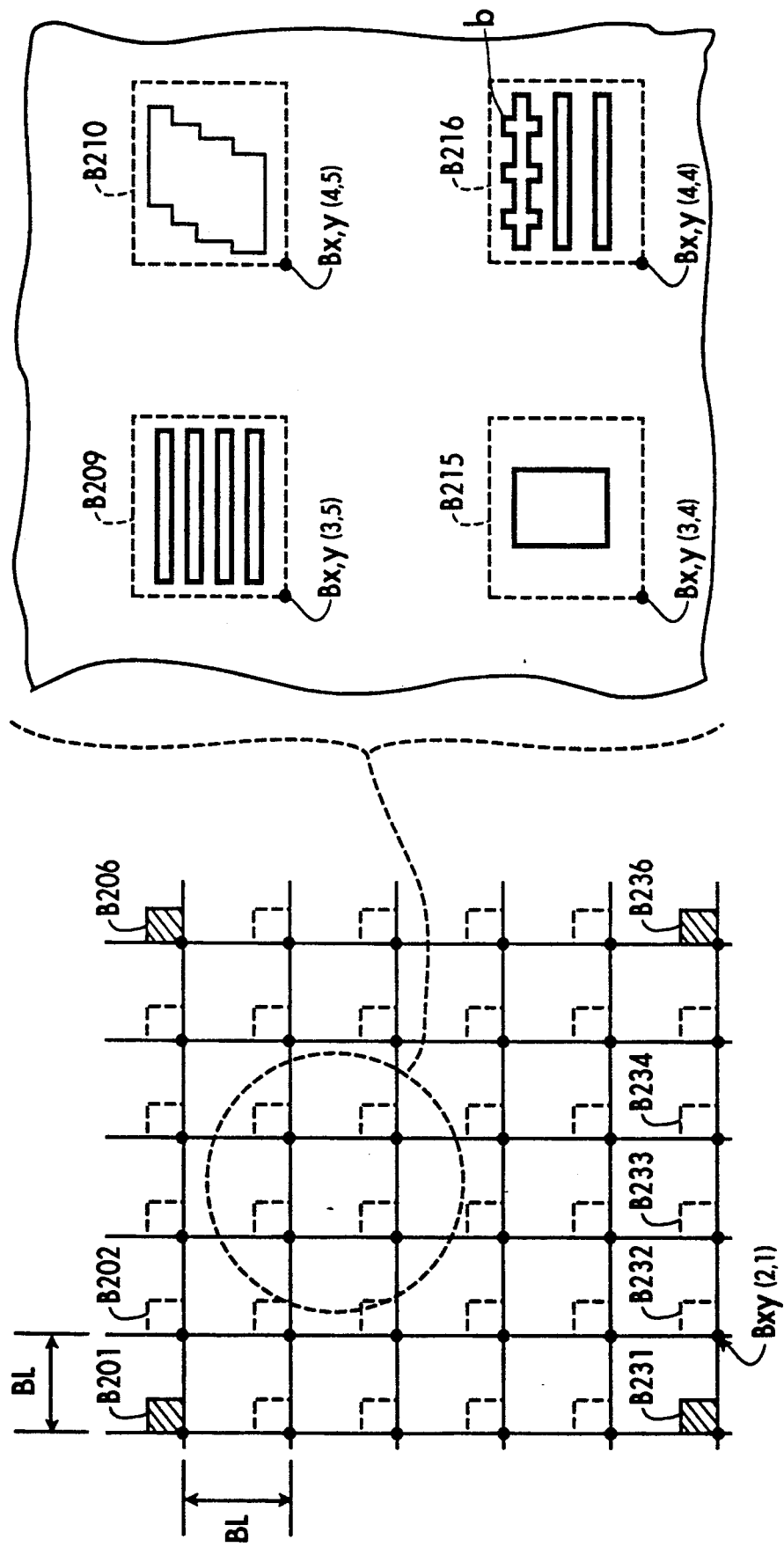

FIGS. 24(a) and 24(b) schematically illustrate a structure of a block pattern group in accordance with the present invention; and more particularly, an entire irradiation area such as E7 of FIG. 23(a). FIG. 24(b) illustrates four of the block patterns arranged within the irradiation area E7. In FIG. 24(b), block pattern B209 includes four parallel lines having equal lengths and pitch. The block pattern B210 corresponds to a staircase block pattern and the block pattern 215 is a simple rectangular pattern. If the block patterns B210 and B215 are on the first stencil mask 61, these patterns can be used to extract further patterns from the block pattern 209 which would be positioned on the second stencil mask 62. Block pattern 216 is a particular block pattern used for exposing the wiring of an address decoder. The region b of block pattern 216 corresponds to the shape of a contact hole.

In accordance with the second embodiment of the present invention, the block patterns B3i on the first stencil mask 61 and the block patterns B4i on the second stencil mask 62 are arranged in the same manner. Thus, the block patterns B3i and B4i can be easily selected. Thus, referring to FIG. 22, the first and second stencil mask 61 and 62 are irradiated with the electron beam 31a. The electron beam 31a is aligned via the first deflection system 32A and the first and second mask shifters 54a and 55 in accordance with the exposure data provided from the exposure data memory 513 through the data memory 51 and pattern controller 52. The pattern controller 52 reads the pattern data from the data memory 51 in accordance with the sequence directed by the sequence controller 58. The pattern data read out of the pattern controller 52 identifies the block mask to be selected and the position to be irradiated on the wafer 37. As shown in FIG. 22, the pattern controller 52 controls the slit deflector 221 and electrostatic deflectors 230A through 230F, as well as the main deflection coil 228 and the subdeflector 229. The data provided by the pattern controller 52 controls the first and second mask shifters 54a and 55 to select the desired block patterns on the stencil masks 61 and 62. After completing the above tasks, the pattern controller 52 sends a signal to the sequence controller 58. The sequence controller 56 then controls the blanking controller to allow the electron beam to pass through the deflector 226 to the lens 224. The deflector 226 therefore determines whether or not the electron beam reaches the wafer 37. The blanking deflector 226 prevents the electron beam from reaching the wafer 37 when the amount of deflection by deflectors 230A through 230F is being changed. The electron beam 31a that is shaped by the two stencil mask 61 and 62 is then reduced and deflected by the second deflection system 32B to form an exposure pattern at the appropriate location of the semiconductor wafer 37.

Figure 25:
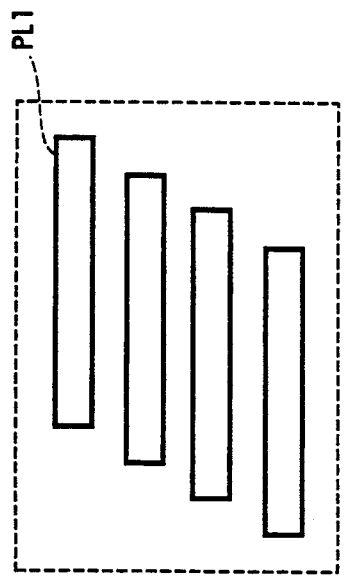
FIGS. 25(a)–25(d) schematically illustrate a variation of the first embodiment of the present invention.

FIGS. 25(a)-25(d) schematically illustrate the exposure method of the second embodiment of the present invention. Specifically, FIGS. 25(a)-25(d) illustrate the process of forming a staircase wiring pattern PL1. For example, if the block pattern B210 is formed on the first stencil mask 61, then the pattern data PD provided by the pattern controller 52 would control the first mask shifter 54a, slit deflector 221, aligning deflectors 230A and 230B are controlled so that the electron beam 31a irradiates the block pattern B210. Next, the irradiation area on the second stencil mask 62 corresponding to block patterns B201-B236 are selected. The selection is performed in accordance with the pattern data PD provided by the pattern controller 52 to the third and fourth deflectors 230E and 230F so as to irradiate the block pattern B209. The electron beam 31a is therefore aligned on the desired block pattern of the second stencil mask 62. The electron beam 31a having passed through the first and second stencil masks 61, 62 irradiates the semiconductor wafer 37 when the blanking deflector 225 is driven and controlled by the blanking controller 56 via the DAC/AMP 57 in accordance with pattern data provided by the pattern controller 52. The sequence controller 58 provides deflection data DD to the deflection controller 59. The deflection controller 59, via DAC/AMPs 510 and 511 drives the main deflection coil 228 and sub-deflector 229 so as to align the staircase exposure pattern at the appropriate location on the semiconductor wafer 37 as shown in FIG. 25(d). In short, the electron beam 31a, after having passing through the first block pattern B210 has a shape corresponding to the white area shown in FIG. 25(b). This beam then passes through the block pattern B209 on the second stencil mask 62 as shown in FIG. 25(c), to form the staircase exposure pattern PL1 shown in FIG. 25(d).

Figure 26:
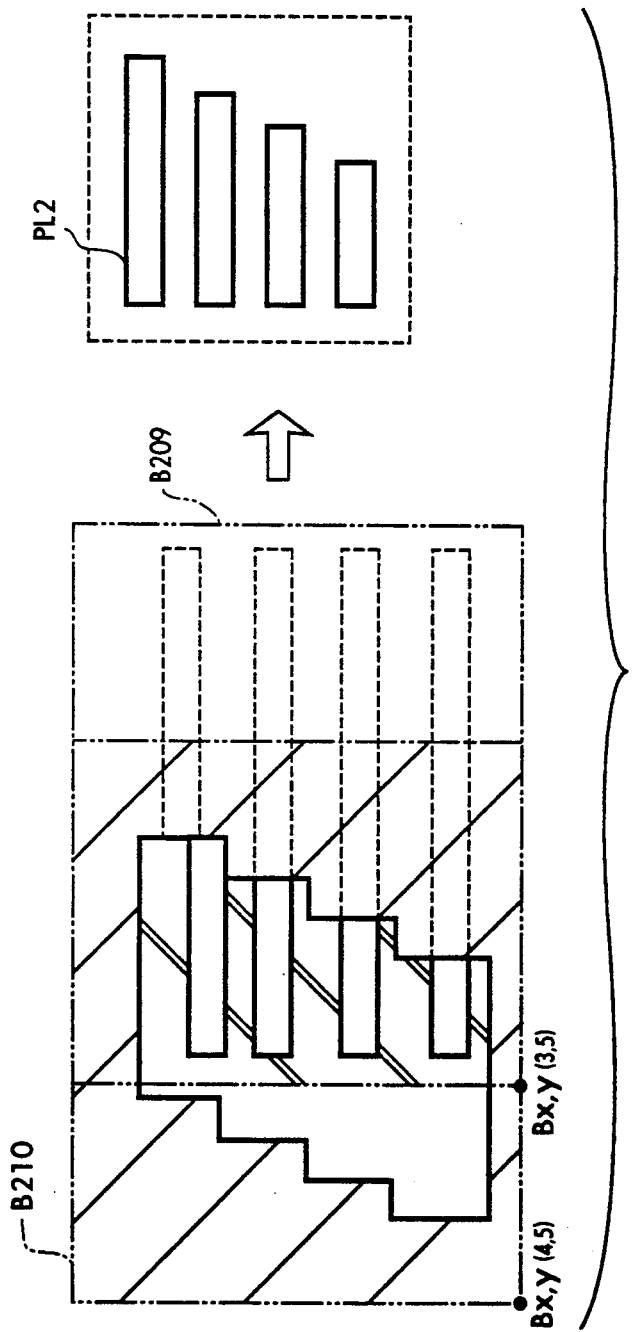
FIGS. 26(a)–26(d) schematically illustrate the exposure method of the second embodiment of the present invention.
Figure 26:
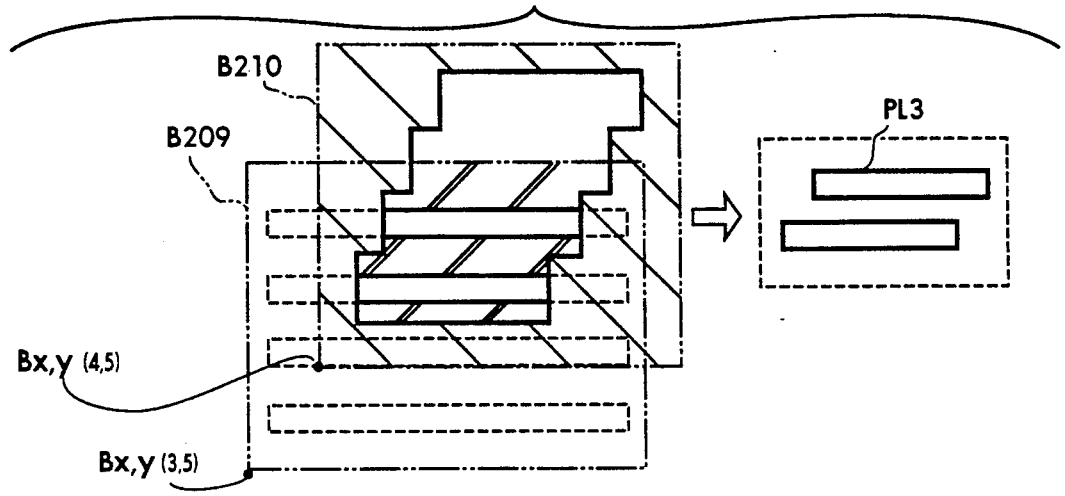
Figure 26:
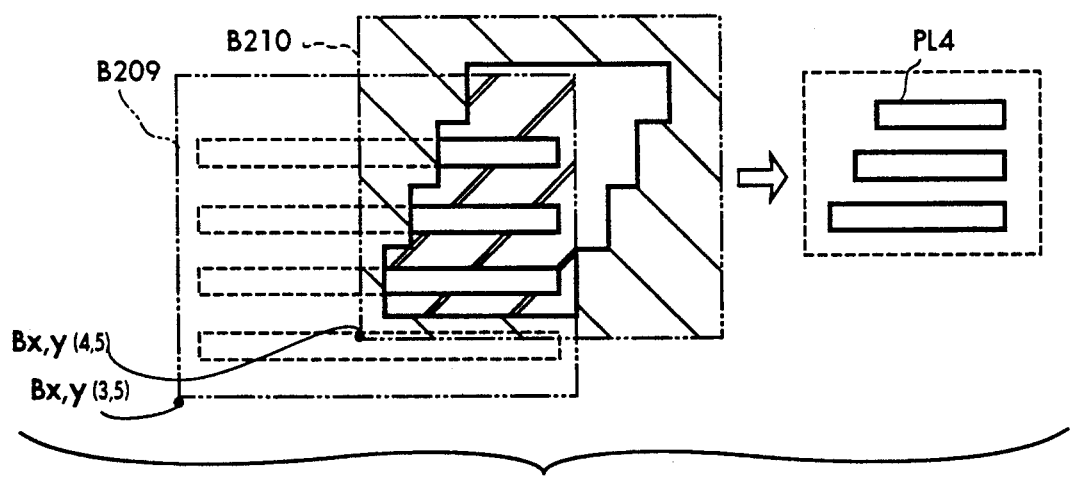
Figure 26:
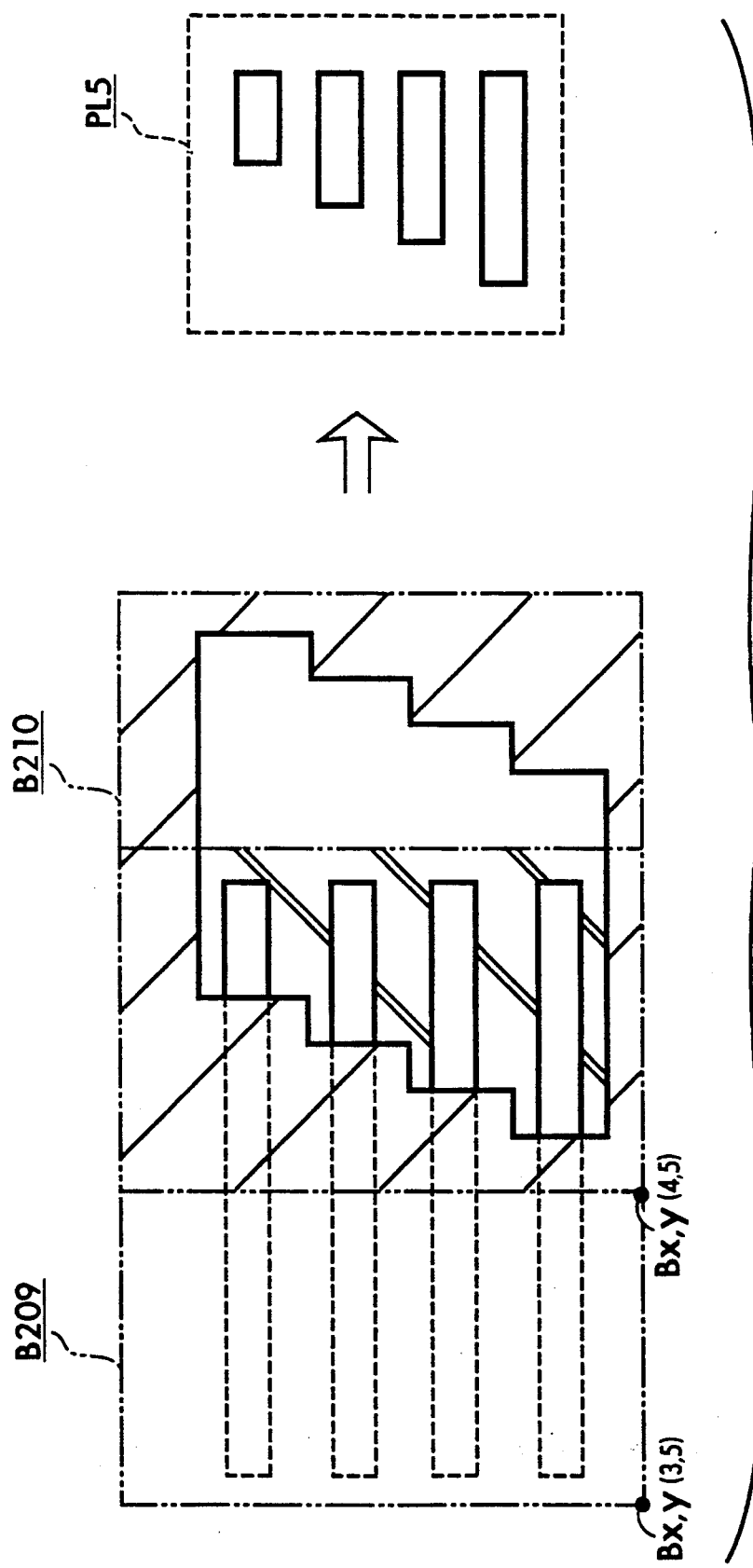

FIGS. 26(a)-26(d) schematically illustrates the exposure method of a variation of the second embodiment of the present invention. To obtain the exposure pattern PL2 shown in FIG. 26(a), the relative positions of the first and second stencil masks 61 and 62 are shifted from those used to form the exposure pattern PL1 and shown in FIG. 25(d). This is accomplished by controlling the first deflection system 32A, and first and second mask shifters 54a and 55 to shift the positions of the reference point $B_{xy}(1, 1)$ and the reference point $B_{xy}(2, 1)$ to the relative positions shown in FIG. 26(a). In particular, the reference point for irradiation of the block pattern B209 of the second stencil mask 62 is changed by deflecting the electron beam 31a that had passed through the block pattern B210 of the first stencil mask 61. This is accomplished by deflecting the electron beam 31a via the third deflection system 32C so that the beam passes through only a portion of the block pattern B209. The staircase exposure pattern PL2 shown in FIG. 26(a) is therefore exposed on the semiconductor wafer 37 via the blanking deflector 226.

Referring to FIG. 26(b), the left-hand portion of this figure shows the relative positions of the first and second stencil masks 61 and 62 used to obtain the exposure pattern PL3 shown in the right-hand portion of this figure. As shown in FIG. 26(b), the reference point of block mask B209 is positioned at reference point $B_{xy}(2, 1)$ and the reference point of block pattern B210 is positioned at reference point $B_{xy}(1, 1)$. In this condition, the reference points of the block masks B209 and B210 are shifted in both the X and Y directions with respect to each other. The third deflection system 32C deflects the electron beam 31a to irradiate the block pattern 209 and form the exposure pattern PL3.

By using the same two block patterns employed to form the exposure patterns PL1, PL2 and PL3, the exposure pattern PL4 can also be formed. Referring to FIG. 26(c), the reference point of block pattern B209 is $B_{xy}(2, 1)$ and the reference point of block pattern B210 is $B_{xy}(1, 1)$. This, by shifting the electron beam 31a exiting the first stencil mask 61, via the third deflection system 32C, the block pattern B209 can be irradiated to form the exposure pattern PL4. Referring to FIG. 26(d), the reference point $D_{xy}(2, 1)$ of the block pattern B209 on the second stencil mask 62 is shifted with respect to the reference point $B_{xy}(1, 1)$ of the block pattern B210 on the first stencil mask 61. With this orientation, the electron beam 31a passing through both of the block patterns forms the exposure pattern PL5 shown in FIG. 26(d).

As is apparent from the above discussion, a great number of exposure patterns can be formed by simply changing the degree of overlap of two block patterns. Thus, various exposure patterns such as PL1-PL5 can be formed with only a small number of block patterns. Thus, it is no longer necessary to provide many different types of block patterns in order to generate exposure patterns for logic circuit patterns. Thus, specialized block patterns for other exposures can be added to the stencil masks 61 and 62. As will be obvious, the order of the stencil masks (e.g., block patterns B209 and B210) on the first and second stencil masks 61 and 62 is not important. They can be reversed with respect to each other.

Figure 27:
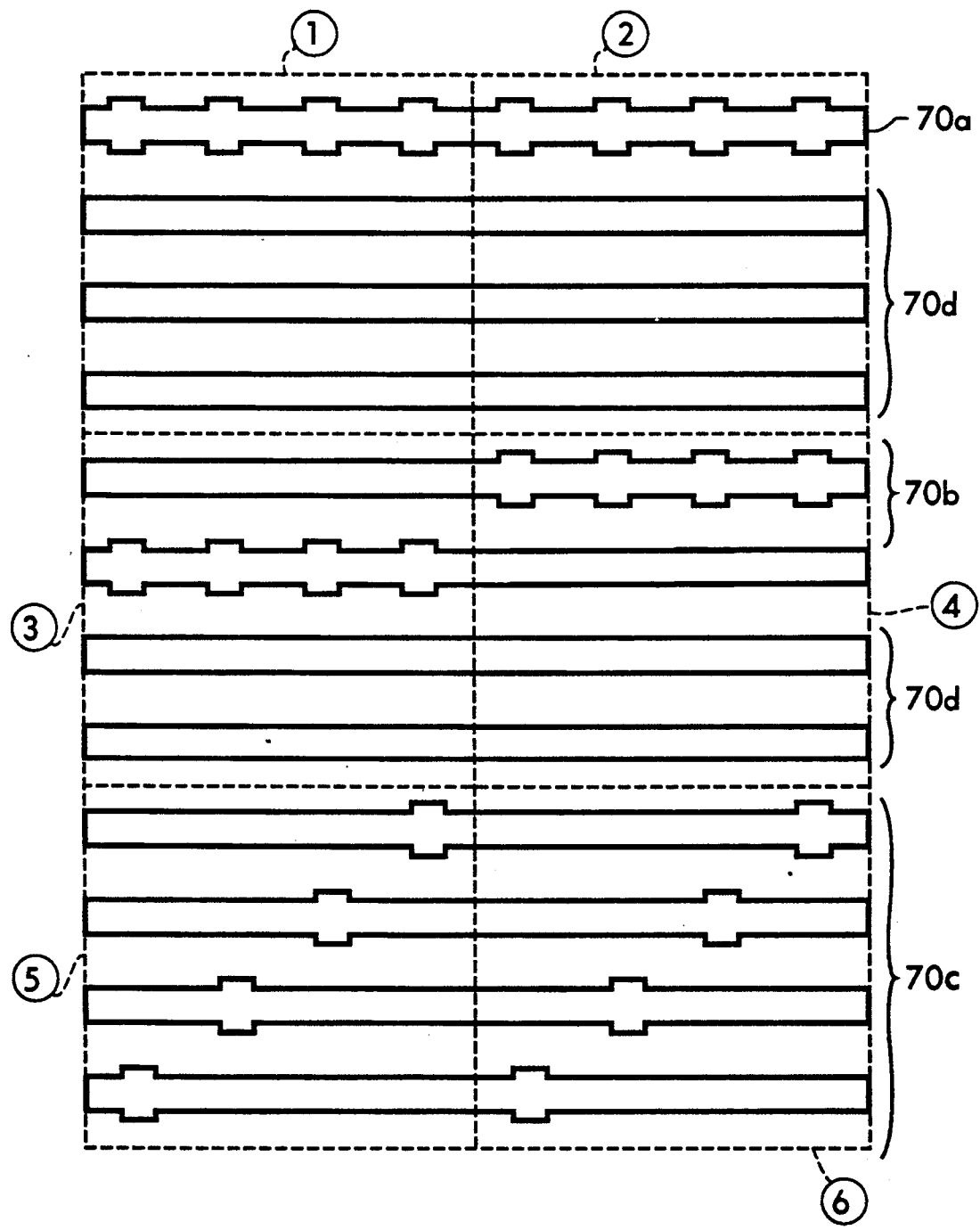
FIG. 27 illustrates an exposure pattern diagram of an address decoder in accordance with the second embodiment of the present invention.
Figure 28:
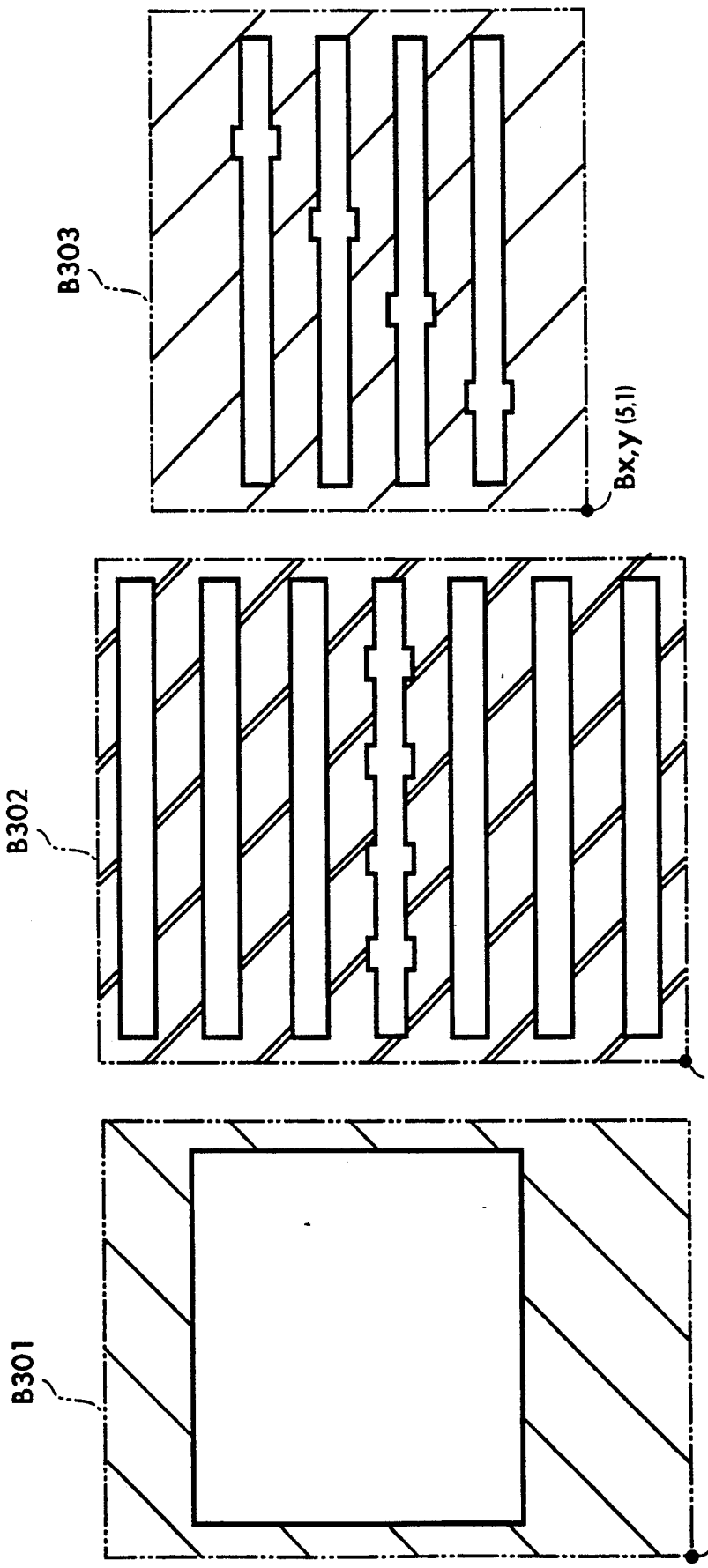
FIGS. 28(a)–28(c) illustrate block patterns useable with the second embodiment of the present invention.
Figure 29:
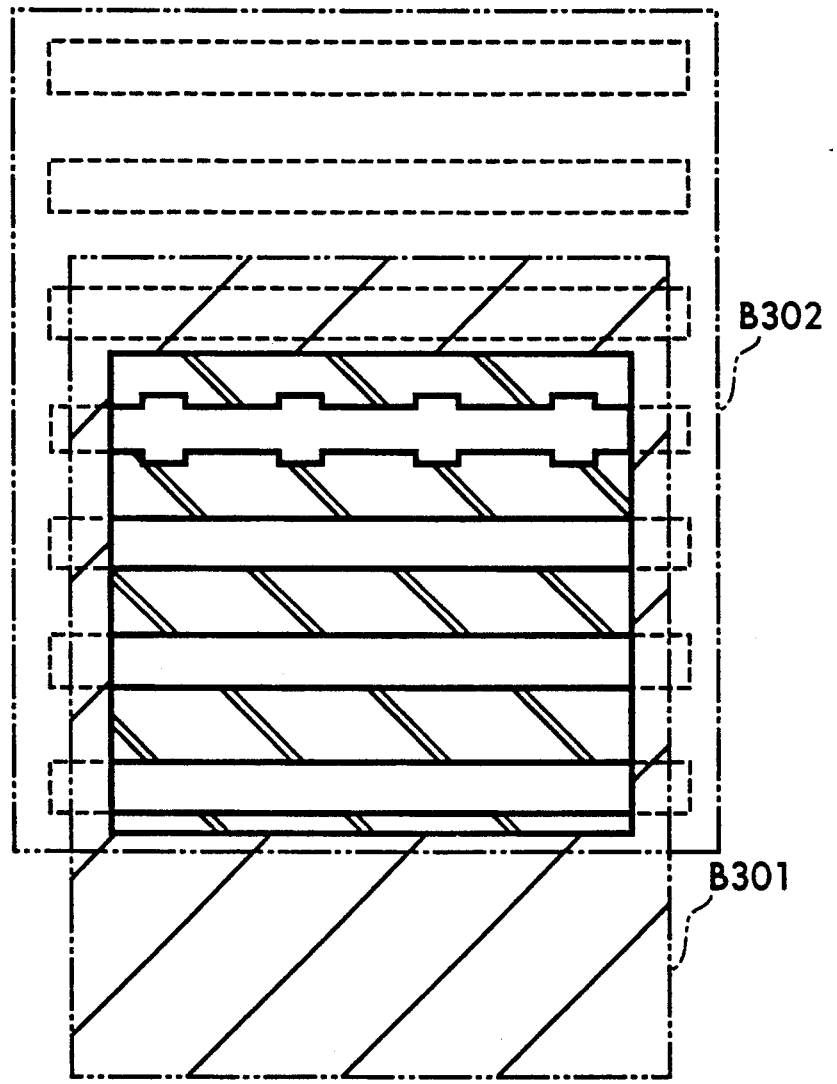
FIGS. 29(a)–29(c) schematically illustrate the profile of a block pattern useable with the second embodiment of the present invention.
Figure 29:
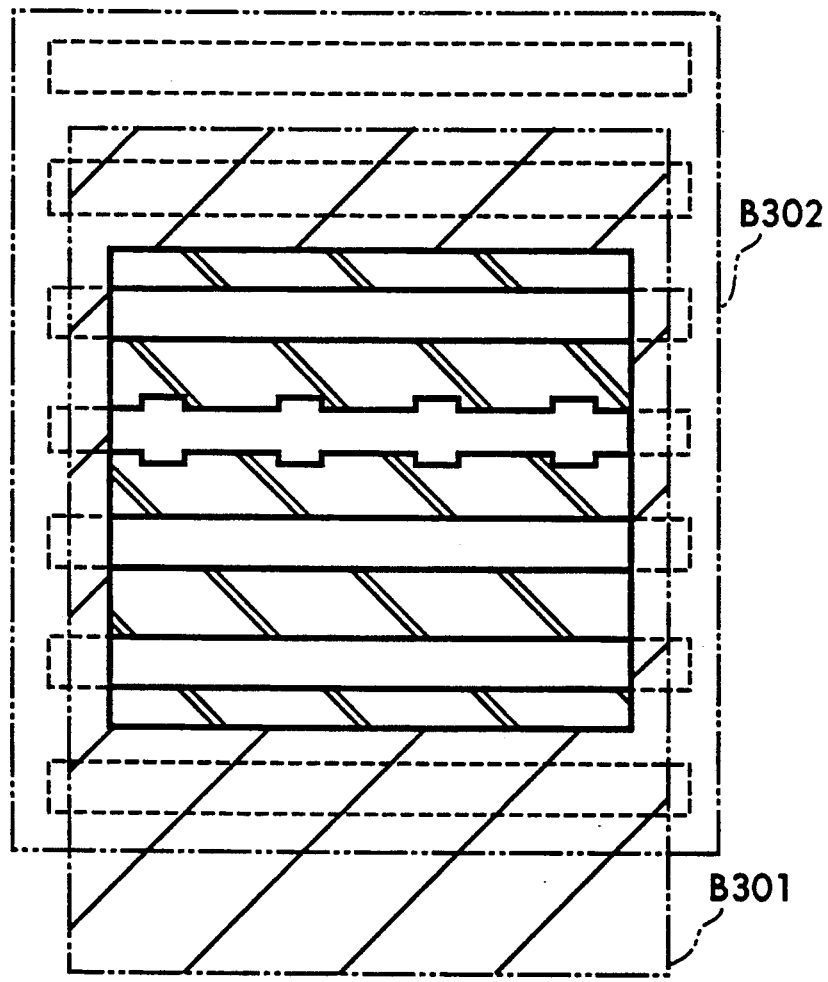
Figure 29:
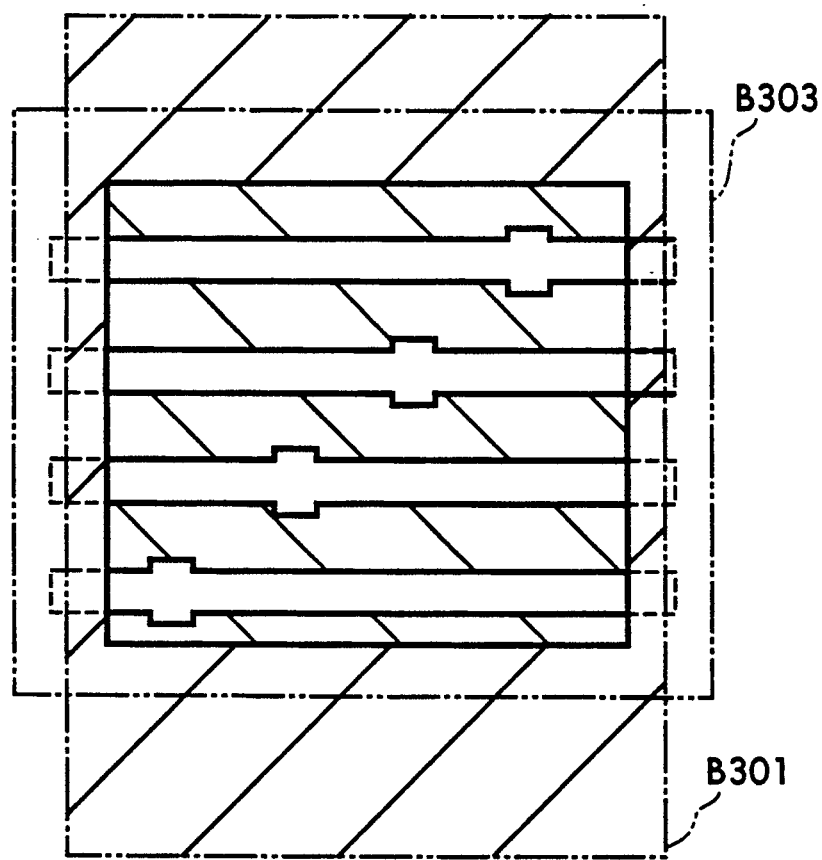

FIG. 27 illustrates an exposure pattern of an address decoder in accordance with the second embodiment of the present invention; and FIGS. 28(a)-28(c) illustrate the combination of block patterns used to form the FIG. 27 exposure pattern. In accordance with the prior art, six block patterns are sequentially exposed to complete the exposure of the FIG. 27 exposure pattern. In accordance with the present invention, as shown in FIGS. 28(a)-28(c), three block patterns B301, B302 and B303 are selected. The block pattern B301 can be formed on the first stencil mask 61, and the block patterns B302 and B303 can be formed on the second stencil mask 62. First, the pattern controller 52 provides pattern data PD to the DAC/AMP 53, the slit deflector 221 and the first and second positioning deflectors 230A and 230B. As a result, the block pattern B301 is irradiated with the electron beam 31a. This provides a square exposure pattern to irradiate any of the block patterns on the second stencil mask 62. Next, the block pattern B302 on the second stencil mask 62 is selected. To form exposure patterns 1 and 2 shown in FIG. 27 including a first contact hole group 70a and linear patterns 70d, the block pattern B301 is aligned with respect to the block pattern B302 as shown in FIG. 29(a). This is accomplished by shifting the relative positions of the first and second stencil masks 61, 62 and deflecting the electron beam 31a via the third deflection system 32C. To form the exposure pattern 3 shown in FIG. 27, including the contact hole pattern, the relative positions of the block pattern B301 and the block pattern B302 and the deflection of the electron beam 31a exiting the first stencil mask 61 is changed so that the block pattern on the second stencil mask B302, is irradiated as shown in FIG. 29(b). The exposure pattern 4 shown in FIG. 27 is exposed in the same manner as discussed with respect to FIG. 29(a).

The exposure patterns 5 and 6 shown in FIG. 27 are generated as follows. The relative positions of the block patterns B301 and B303 and the deflection of the electron beam 31a exiting the first stencil mask 61 are altered as shown in FIG. 29(c). More particularly, the third deflection system 32C is controlled so that the image of the electron beam 31a passing through the block pattern B301 formed on a first stencil mask 61 irradiates the entire block pattern B303 formed on the second stencil mask 62. Through the above procedure, the exposure pattern for an address decoder can be formed on the semiconductor wafer 37 by quickly exposing the blocks 1-6 of FIG. 27, using only three block patterns shown in FIGS. 28(a)-28(c). In fact, to form the exposure patterns 1-4 of FIG. 27, only two block patterns B301 and B302 are needed. The time required to select a block pattern is minimized and the throughput of an exposure apparatus is significantly improved. In addition, it is no longer necessary to provide specialized block patterns for exclusive logic circuit functions on stencil masks.

Figure 30:
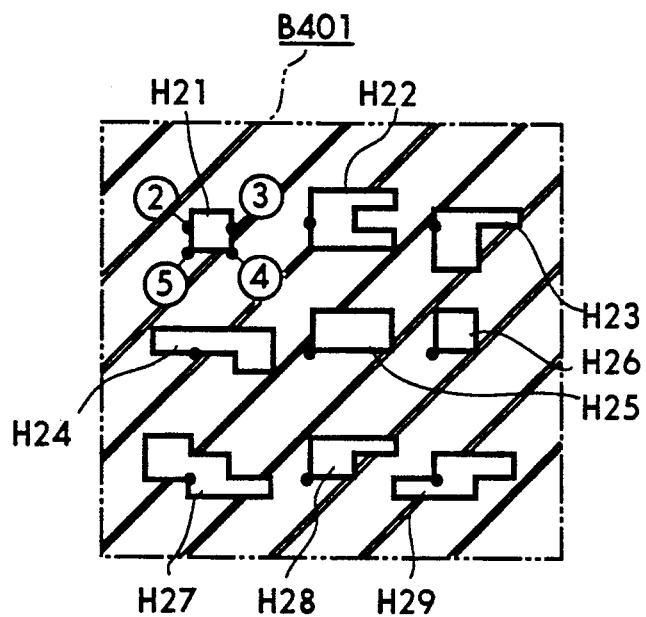
FIGS. 30(a)–30(d) schematically illustrate an example window pattern in accordance with a third embodiment of the present invention.
Figure 30:
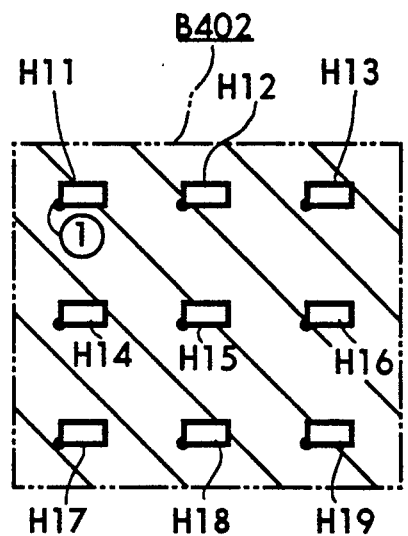
Figure 30:
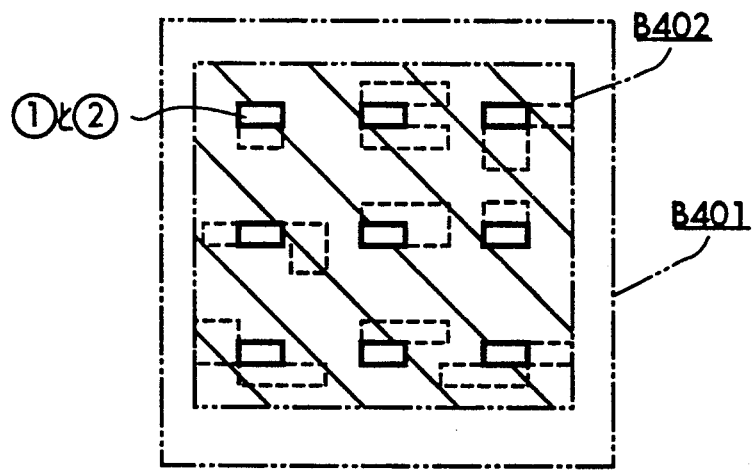
Figure 30:
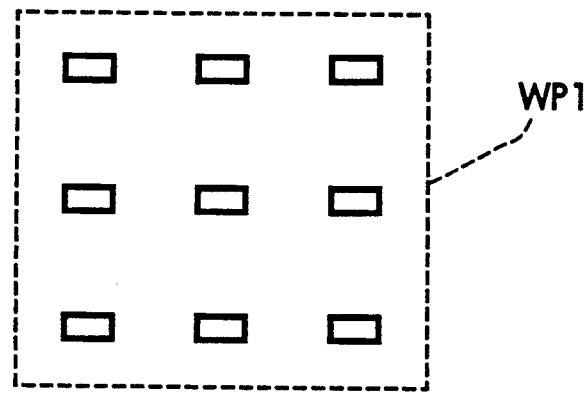

FIGS. 30(a)-30(d) schematically illustrate an example of an exposure process in accordance with the third embodiment of the present invention. Referring to FIG. 30(a), the block pattern B401 is formed on one of the stencil masks 61, 62, while the block pattern B402 is formed on the other one of the stencil masks 61, 62. The order is not important to the present invention. For the purposes of discussion, only, the block pattern B401 is discussed as being located on the first stencil mask 61, and the block pattern B402 is discussed as being on the second stencil mask 62. In the following, the block masks B401 and B402 are aligned with respect to each other to form contact hole windows for various layouts. Referring to FIG. 30(c), the block pattern B401 and the block pattern B402 are aligned with respect to each other, and the third deflection system 32C controlled so that the reference point 1 of reference pattern B402 is aligned with reference point 2 of block pattern B401 as shown in FIG. 30(c). With this orientation of the block patterns B401 and B402 and deflection of the electron beam 31a, a window exposure pattern WP1 including a matrix of nine contact hole windows can be formed on the semiconductor wafer 37 as shown in FIG. 30(d). Using the same block patterns, the window exposure pattern WP2 of FIG. 31(a) can be formed on the semiconductor wafer 37. To form the window exposure pattern WP2, a reference position 3 of beam passing section H21 of block pattern B401 is aligned with respect to reference point 1 of beam passing section H11 of block pattern B402. This orientation is shown in the left-hand portion of FIG. 31(a). One way that the positional relationship shown in FIG. 31(a) can be obtained is by comparing the positional coordinate data of the reference position 3 of beam passing section H21 and the positional coordinate data of reference position 1 of beam passing element H11; and moving one of the stencil masks 61, 62 with respect to each other.

Figure 31:
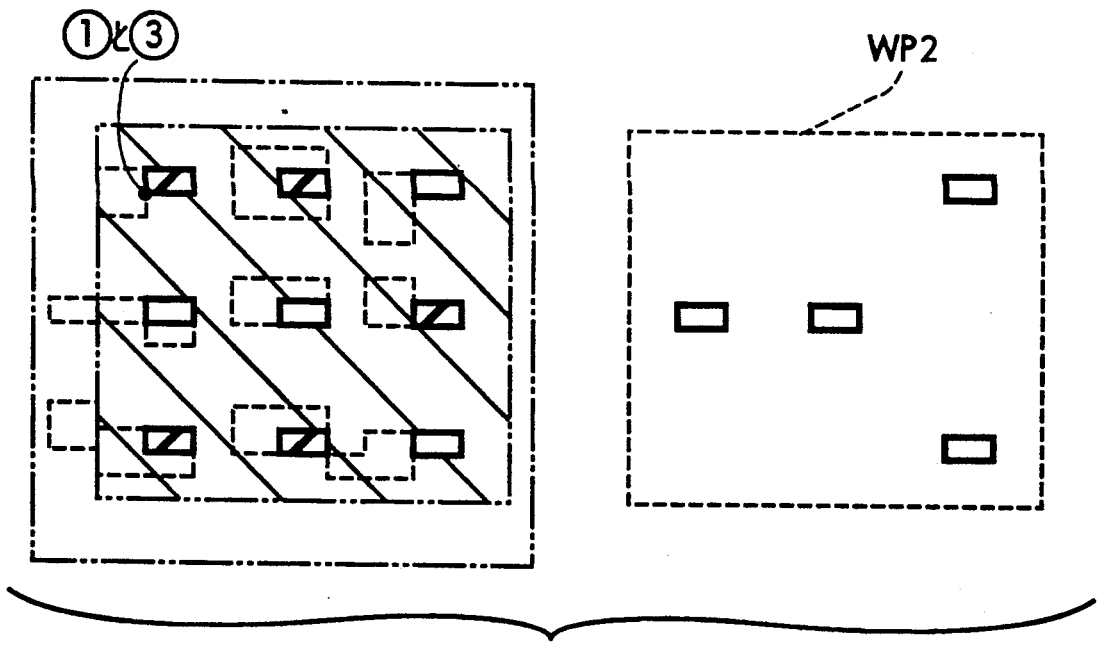
FIGS. 31(a) and 31(b) schematically illustrate a block pattern overlapping position adjusting process in accordance with the third embodiment of the present invention.
Figure 31:
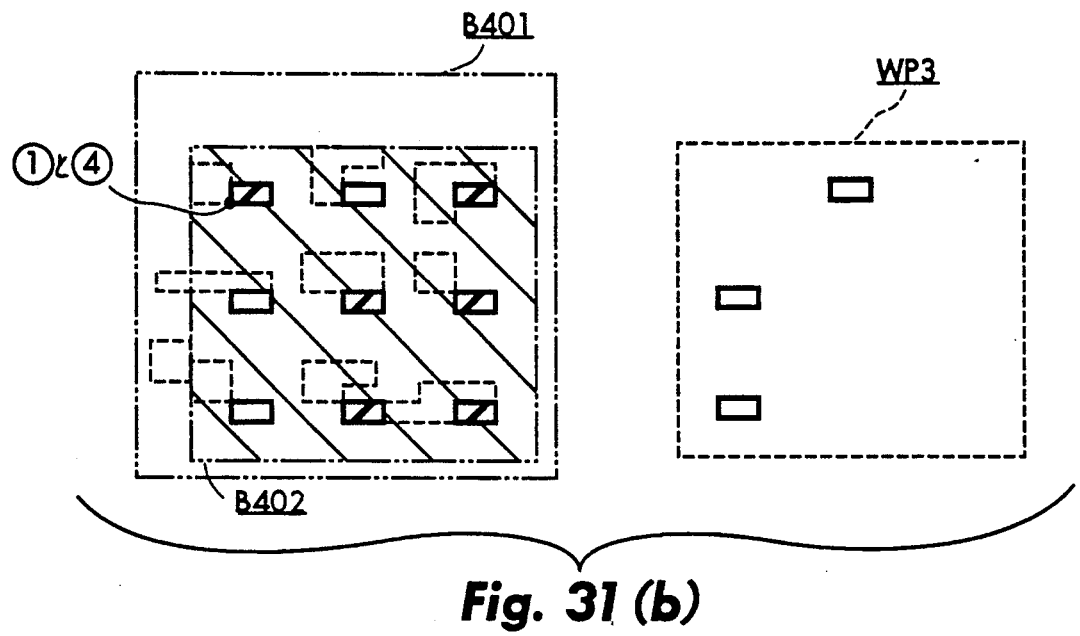
Figure 31:
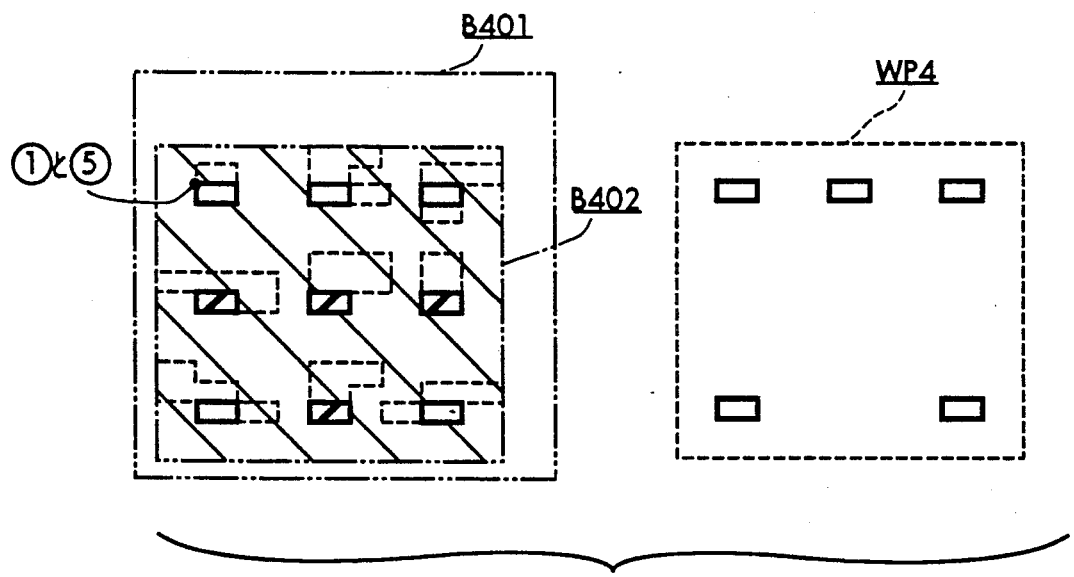

Referring to FIG. 31(b), the reference position 4 of the beam passing through beam passing element H21 is aligned with reference position 1 of beam passing element of H11. With this special relationship between the electron beam 31a passing through the first stencil mask 61 and the second stencil mask 62, the window exposure pattern WP3 can be formed on the semiconductor wafer 37 as shown in the right-hand portion of FIG. 31(b). This window exposure pattern corresponds to the electron beam 31a passing through the beam passing elements H12, H14 and H17 of block pattern B402.

Referring to FIG. 31(c), the reference position 5 of the electron beam 31a passing through the beam passing element H21 is aligned with reference position 1 of beam passing element H11. With this orientation, the window exposure pattern WP4 can be formed on the semiconductor wafer 37. This window exposure pattern results from the electron beam 31a passing through beam passing elements H11, H12, H13, H17 and H19 of block pattern B402. Thus, with only two block patterns B401 and B402, at least four different window exposure patterns WP1-WP4 can be formed. It is therefore no longer necessary to provide many different window exposure patterns. Thus, the throughput of a block exposure apparatus can be significantly improved.

The structure of an electron beam exposure apparatus in accordance with the third embodiment of the present invention is similar to the structure of the apparatus shown in FIG. 22 with respect to the second embodiment of the present invention. Therefore, the explanation of such an apparatus is not repeated.

Figure 32:
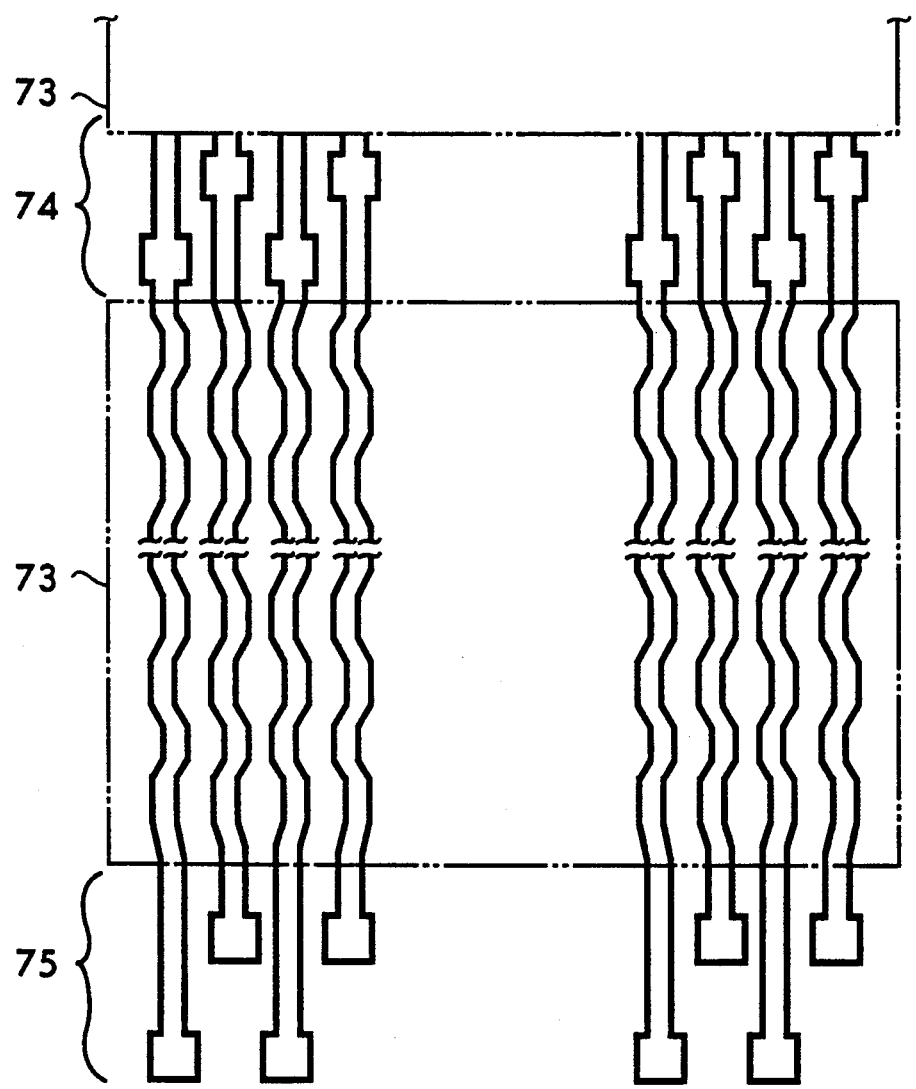
FIG. 32 illustrates an example memory pattern to which the present invention can be applied.

FIG. 32 illustrates an example memory pattern to which the present invention can be applied. In FIG. 32, reference numeral 73 denotes a wiring pattern for a memory cell. Reference numeral 74 identifies a wiring pattern connecting potions of the wiring patterns of the memory cells. Reference numeral 75 identifies a wiring pattern for connecting portions of the wiring patterns in the memory cell 73 with peripheral circuits of the memory cell.

Figure 33:
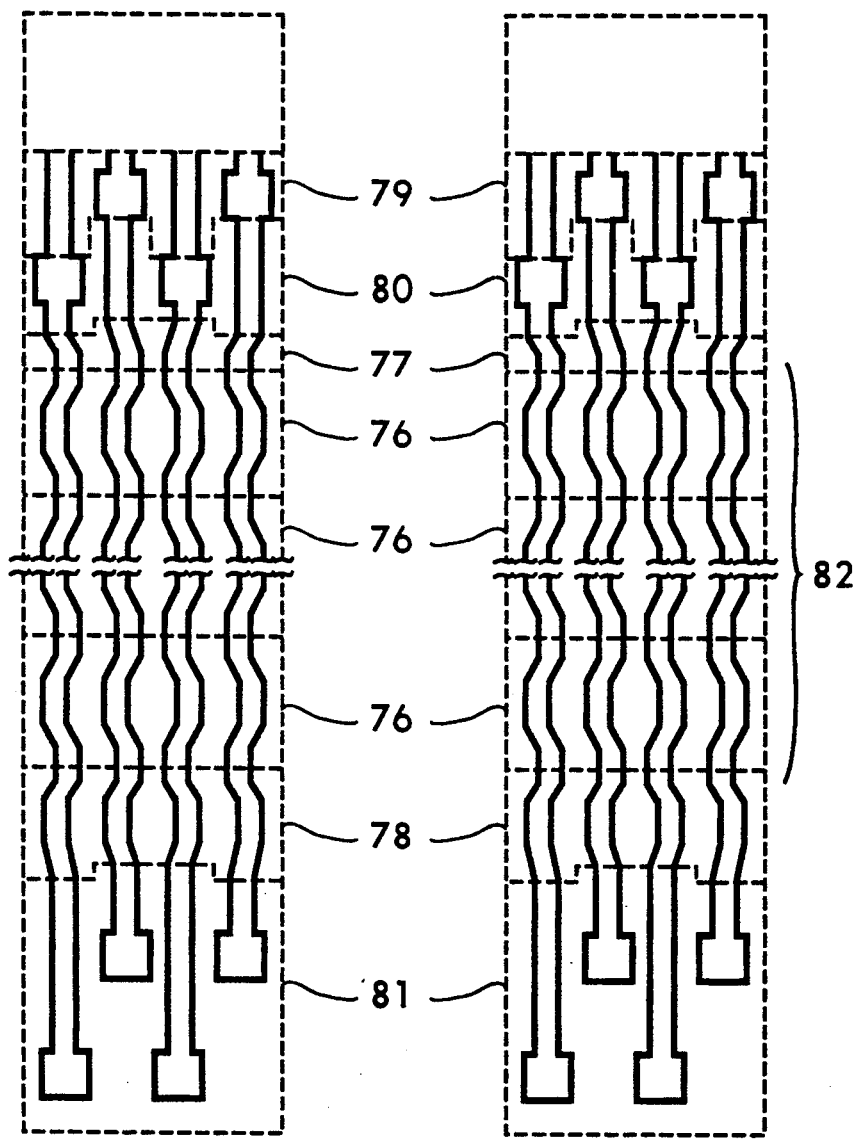
FIG. 33 illustrates an example of divided memory pattern version of the FIG. 32 memory pattern.
Figure 34:
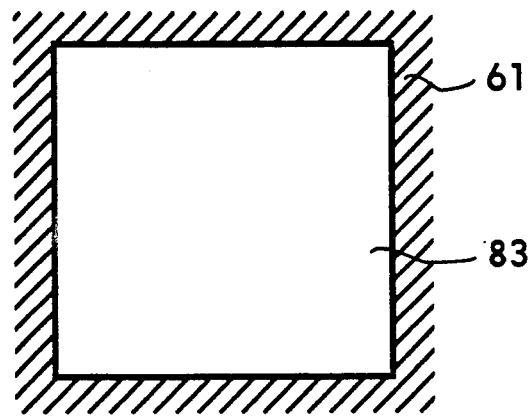
FIG. 34 to FIG. 37 illustrate block patterns formed on a stencil mask in accordance with the third embodiment of the present invention.
Figure 35:
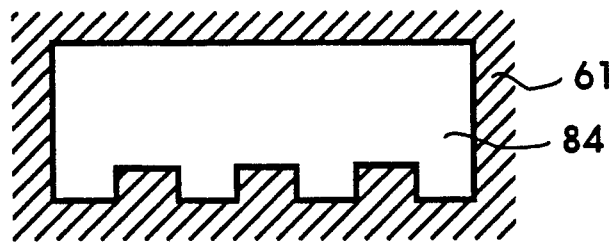
Figure 36:
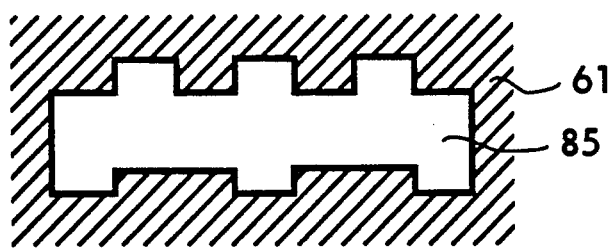
Figure 37:
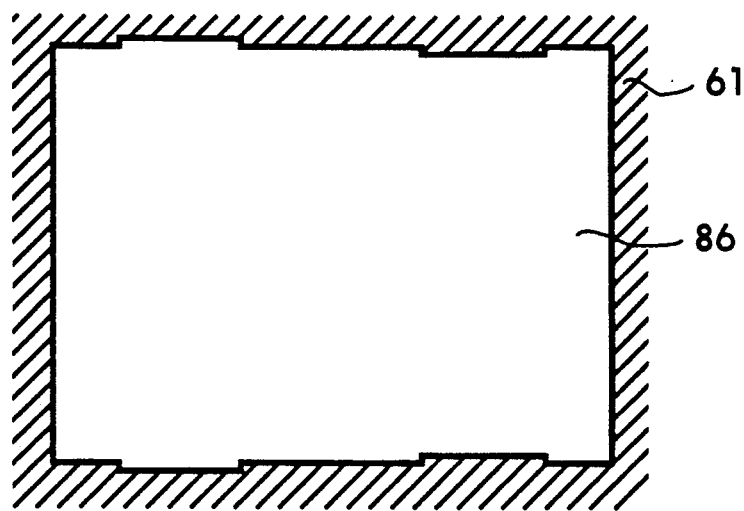
Figure 38:
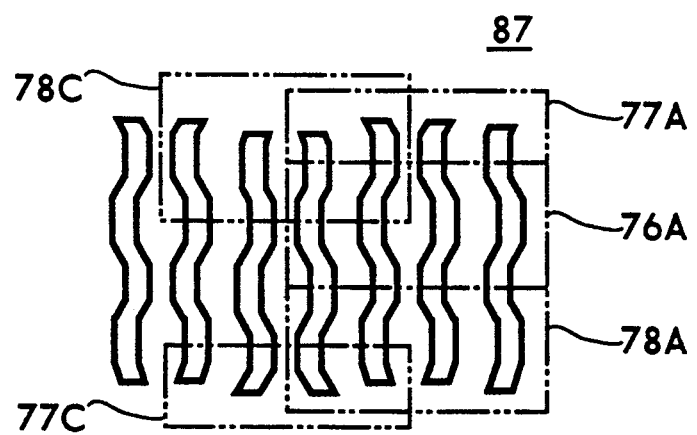
FIG. 38 to FIG. 39 illustrate block patterns formed on a stencil mask in accordance with the third embodiment of the present invention.
Figure 39:
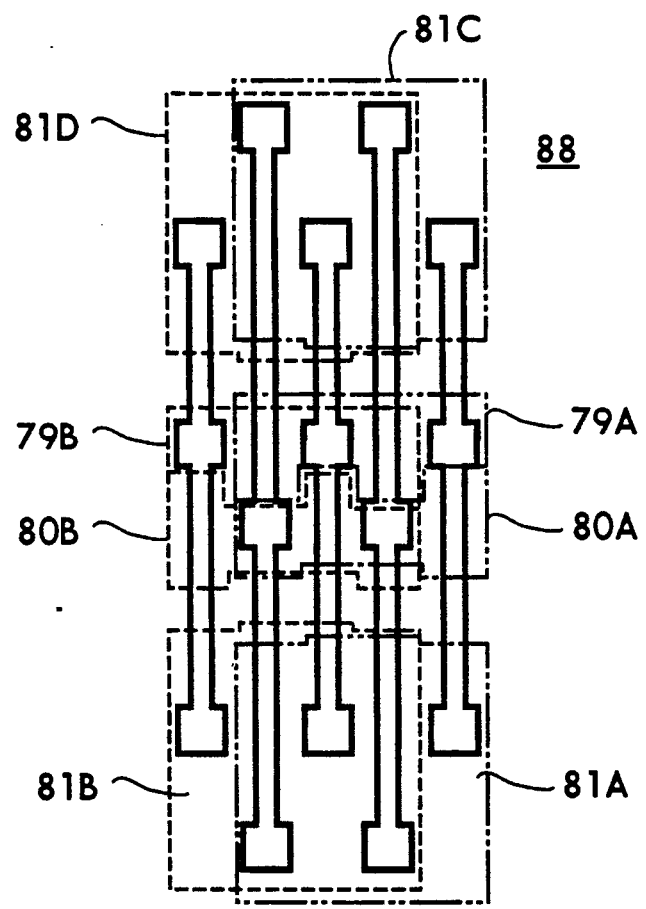

The wiring patterns shown in FIG. 32 can be divided into six types of wiring patterns and are respectively identified with reference numerals 76-81 in FIG. 33. For example, reference numeral 82 identifies a portion of the wiring pattern where the pattern 76 is repeated. In the following discussion, the block patterns 83-86 are respectively illustrated in FIGS. 34-37 are discussed as being formed on the first stencil mask 61. The block patterns 87-88 shown in FIGS. 38-39 are discussed as being formed on the second stencil mask 62. Referring to FIG. 38, a block pattern 87 comprises beam passing elements 76A, 77A and 78A that correspond to the wiring patterns 76, 77 and 78. The block pattern 87 also includes beam passing elements 77C and beam passing element 78C. In addition, referring to FIG. 39, a block pattern 88 comprises beam passing elements 79A and 80A that respectively correspond to patterns 79 and 80. The block pattern 88 also includes beam passing element 79B, beam passing element 80B, beam passing element 81B, beam passing element 81C and beam passing element 81D.

Figure 3:
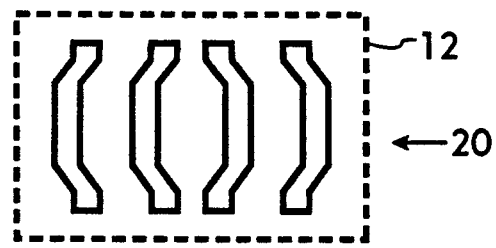
FIG. 3 is a diagram indicating an example of block pattern formed on a block mask of FIG. 2.
Figure 40:
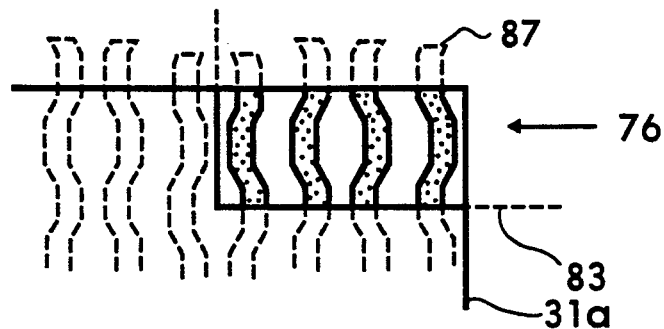
FIG. 40 to FIG. 52 illustrate profiles of block mask exposure in accordance with the third embodiment of the present invention.
Figure 41:
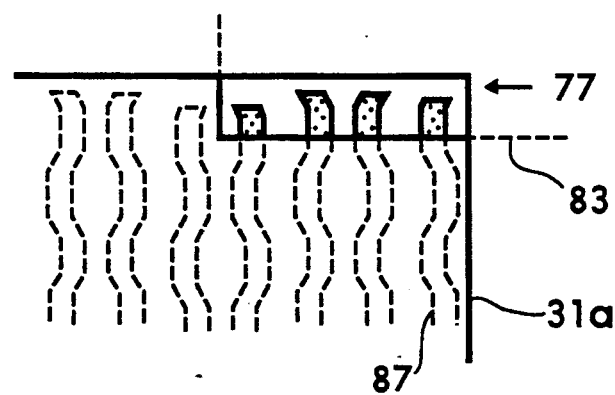

The exposure pattern for the wiring pattern 76 shown in FIG. 3 can be formed as follows. The electron beam 31a passes through the rectangular shaping aperture 31D, block pattern 83 (FIG. 34) formed on the first stencil mask 61 and the block pattern 87 (FIG. 38) formed on the second stencil mask 62. The resultant pattern is illustrated in FIG. 40. A portion of the exposure pattern corresponding to the wiring pattern 77 shown in FIG. 33 can also be formed as follows. The electron beam 31a passes through the rectangular shaping aperture 31D (FIG. 22), block pattern 83 (FIG. 34) formed on the first stencil mask 61, and block pattern 87 (FIG. 38) formed on the second stencil mask 62 as shown in FIG. 41. The combination of exposure patterns shown in FIGS. 40 and 41 forms the central and upper portion of the exposure pattern corresponding to the wiring pattern 76 shown in FIG. 33.

Figure 42:
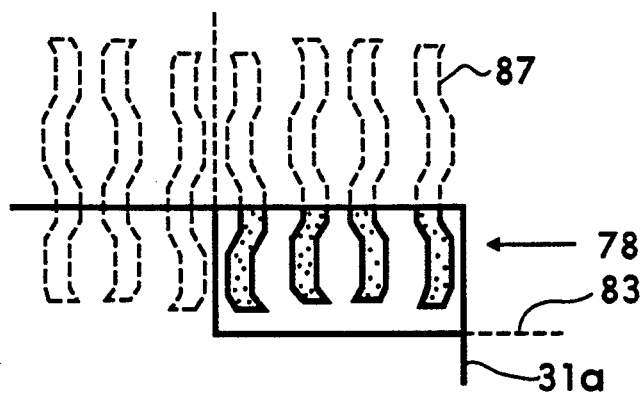

The exposure pattern corresponding to the wiring pattern 78 shown in FIG. 33 can be formed as follows. The electron beam 31a is passed through the rectangular shaping aperture 31D (FIG. 22), block pattern 83 (FIG. 34) formed on the first stencil mask 61 and block pattern 87 (FIG. 38) formed on the second stencil mask 62 as shown in FIG. 42.

Figure 43:
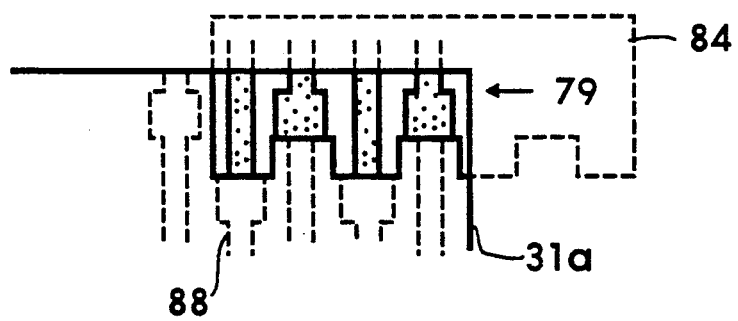
Figure 44:
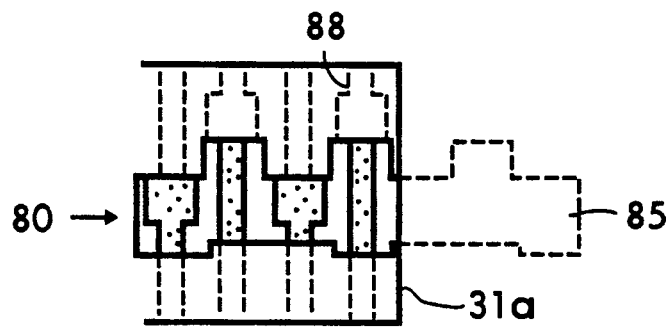
Figure 45:
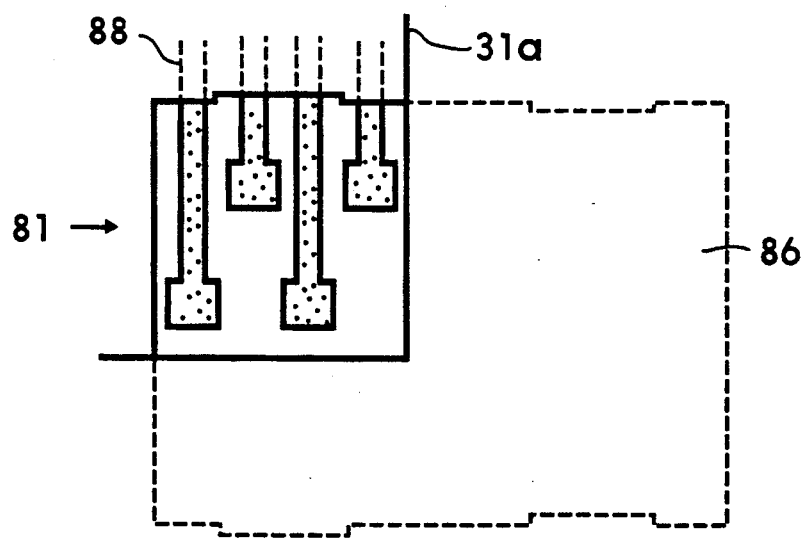

The exposure pattern corresponding to the wiring pattern 79 shown in FIG. 33 can be formed as follows. The electron beam 31a passes through the rectangular shaping aperture 31D (FIG. 22), block pattern 84 (FIG. 35) formed on the first stencil mask 61, and block pattern 88 (FIG. 39) formed on the stencil mask 62 as shown in FIG. 43. The exposure pattern corresponding to the wiring pattern 80 shown in FIG. 33 can be formed as follows. The electron beam 31a passes through the rectangular shaping aperture 31D (FIG. 22), block pattern 85 (FIG. 36) formed on the first stencil mask 61, and block pattern 88 (FIG. 39) formed on the second stencil mask 62 as shown in FIG. 44. The exposure pattern corresponding to the wiring pattern 81 shown in FIG. 33 can be formed as follows. The electron beam 31a passes through the rectangular shaping aperture 31D (FIG. 22), the block pattern 86 (FIG. 37) formed on the first stencil mask 61, and the block pattern 88 (FIG. 39) formed on the second stencil mask 62 as shown in FIG. 45.

Figure 46:
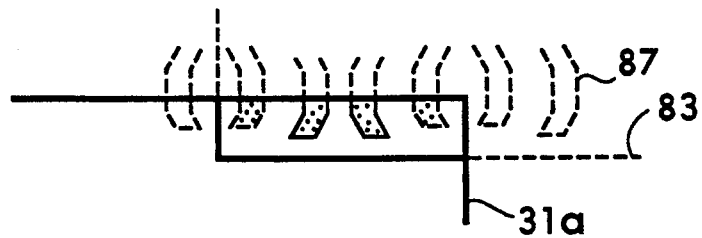
Figure 47:
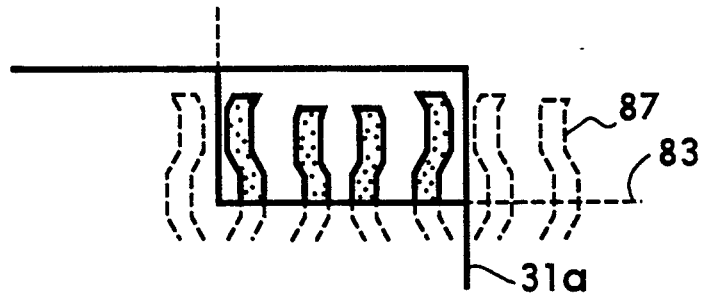
Figure 48:
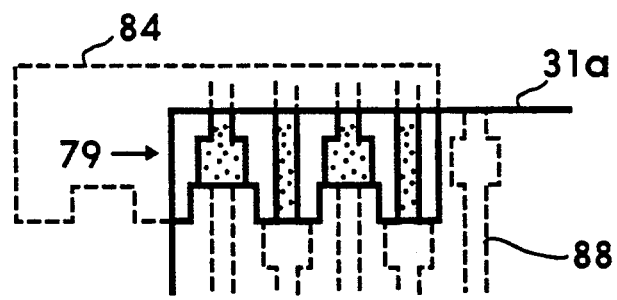
Figure 49:
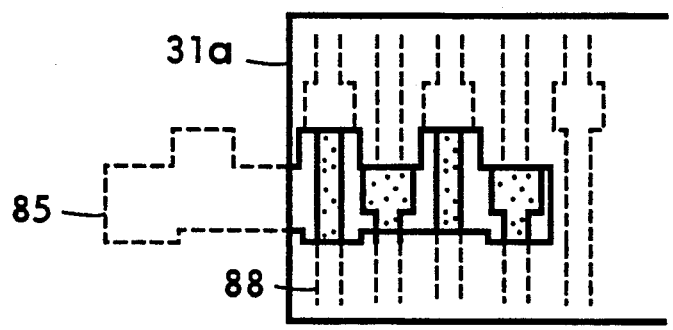
Figure 50:
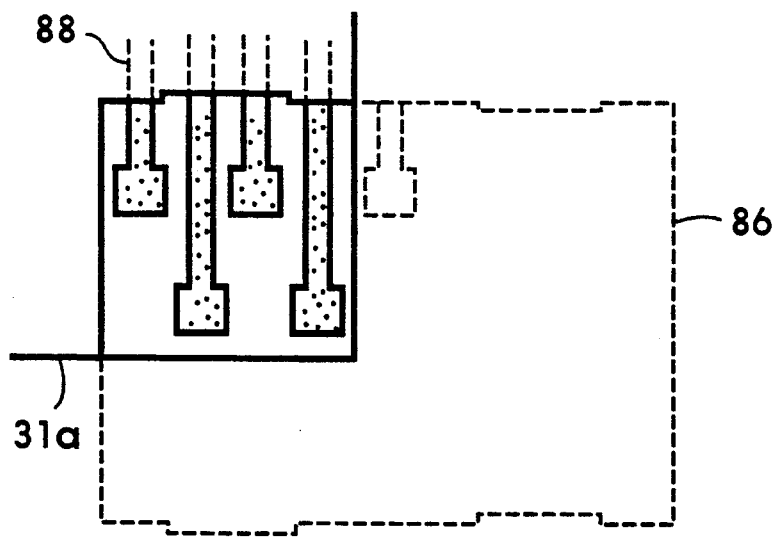
Figure 51:
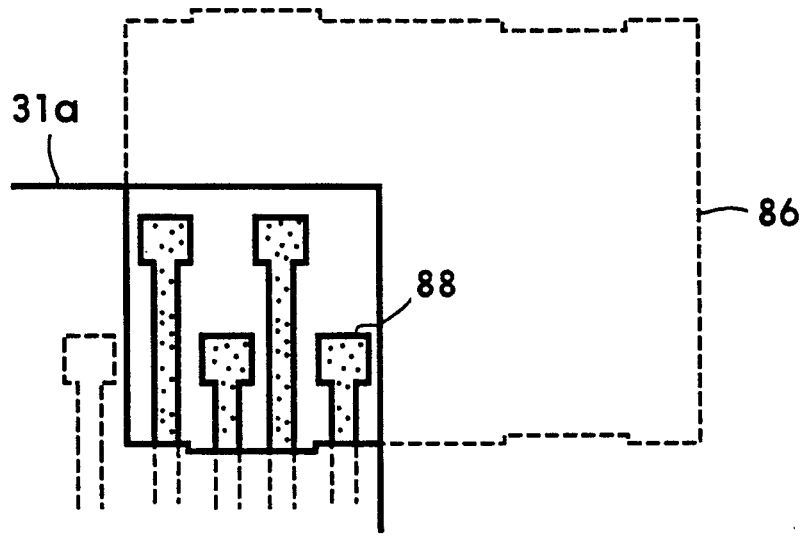
Figure 52:
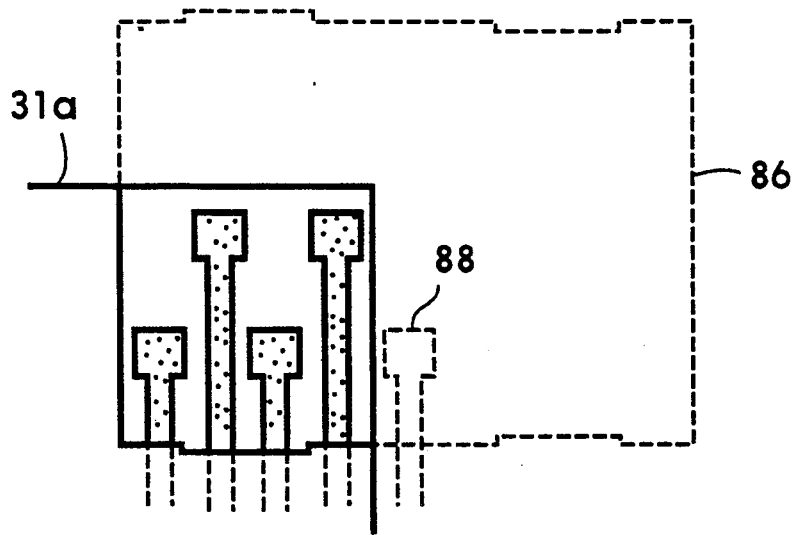

A pattern that is vertically symmetrical with respect to the exposure pattern 77 can be formed as follows. The electron beam 31a passes through the rectangular shaping aperture 31D (FIG. 22), the block pattern 83 (FIG. 34) formed on the first stencil mask 61, and the block pattern 87 (FIG. 38) formed on the second stencil mask 62 as shown in FIG. 46. A pattern that is vertically symmetrical with respect to the exposure pattern 78 can be formed as follows. The electron beam 31a passes through the rectangular shaping aperture 31D (FIG. 22), the block pattern 83 (FIG. 34) formed on the first stencil mask 61, and the block pattern 87 (FIG. 38) formed on the second stencil mask 62 as shown in FIG. 47. A pattern that is horizontally symmetrical with respect to the exposure pattern 79 can be formed as follows. The electron beam 31a passes through the rectangular shaping aperture 31D (FIG. 22), the block pattern 84 (FIG. 35) formed on the first stencil mask 61, and the block pattern 88 (FIG. 39) formed on the second stencil mask 62 as shown in FIG. 48. Another pattern which is horizontally symmetrical with respect to the exposure pattern 80 can be formed as follows. The electron beam 31a passes through the rectangular shaping aperture 31D (FIG. 22), the block pattern 85 (FIG. 36) formed on the first stencil mask 61, and the block pattern 88 (FIG. 39) formed on the second stencil mask 62 as shown in FIG. 49. An additional pattern that is horizontally symmetrical with respect to the exposure pattern 81 can be formed as follows. The electron beam 31a passes through the rectangular shaping aperture 31D (FIG. 22), the block pattern 86 (FIG. 37) formed on the first stencil mask 61, and the block pattern 88 (FIG. 39) formed on the second stencil mask 62 as shown in FIG. 50. An exposure pattern that is vertically symmetrical with respect to the exposure pattern 81 can be formed as follows. The electron beam 31a passes through the rectangular shaping aperture 31D (FIG. 22), the block pattern 86 (FIG. 37) formed on the first stencil mask 61, and the block pattern 88 (FIG. 39) formed on the second stencil mask 62 as shown in FIG. 51. FInally, an additional exposure pattern that is rotatably symmetrical with respect to the exposure pattern 81 can be formed as follows. The electron beam 31a passes through the rectangular shaping aperture 31D (FIG. 22), the block pattern 86 and the block pattern 88 as shown in FIG. 52.

With the third embodiment of the present invention, exposure patterns corresponding to the wiring patterns 76, 77 and 78 shown in FIG. 33 can be formed utilizing the block pattern 87 and block pattern 83. It is therefore no longer necessary to use three different block patterns as was previously required. In addition, the block pattern 87 shown in FIG. 38 includes patterns 77A and 78A. These patterns correspond to the patterns 77 and 78 shown in FIG. 33. The repetitive portion 76 of FIG. 33 corresponds to the intermediate portion 76A of block pattern 87. Thus, to form the exposure patterns corresponding to wiring pattern 76, 77 and 78, it is necessary to only use the block patterns 83 and 87 respectively shown in FIGS. 34 and 38. In addition, since the block pattern 87 includes the patterns 77C and 78C that are vertically symmetrical with respect to corresponding patterns 77A and 78A. It is therefore not necessary to form individual block patterns, corresponding to the portions 78C and 77C of block pattern 87. Referring to block pattern 88 in FIG. 39, this pattern includes patterns 79B and 80B that are horizontally symmetrical with respect to the corresponding patterns 79A and 80A. It is therefore no longer necessary to independently form block patterns corresponding to the patterns 79B and 80B. Similarly, in block pattern 88 shown in FIG. 39, the pattern 81B is horizontally symmetrical with respect to the pattern 81A; the pattern 81C is vertically symmetrical to the pattern 81A; and the pattern 81D is rotatably symmetrical with respect to the pattern 81A. It is therefore not necessary to independently form patterns for 81B, 81C or 81D.

In accordance with the present invention, a charged particle beam is shaped into variable rectangular forms and used to partially irradiate a block pattern. In accordance with the present invention, a large variety of exposure patterns can be formed with a small number of block patterns. Accordingly, it is possible to include specialized blocked patterns on a stencil mask. In accordance with the present invention, the number of patterns that may be formed on a block mask can be significantly increased, and the throughput of an exposure apparatus improved.

We claim:

1. A charged particle beam mask for use in an exposure apparatus including a beam generator, a beam deflector and a beam shaper and permeable to a charged particle beam, comprising:
   a substrate; and
   a first permeable pattern formed on said substrate including a first plurality of substantially rectangular beam passing sections arranged in parallel and to have a parallelogram shape,
   wherein the exposure apparatus rotates said first permeable pattern to form a bending pattern.

2. A charged particle beam mask for use in an exposure apparatus including a beam generator, a beam deflector and a beam shaper and permeable to a charged particle beam, comprising:
   a substrate; and
   a first permeable pattern formed on said substrate including a plurality of substantially rectangular beam passing sections arranged in parallel and to have a trapezoidal shape.

3. A charged particle beam mask according to claim 2, wherein said mask further includes:
   a second permeable pattern formed on said substrate including a second plurality of substantially rectangular beam passing sections arranged in parallel at approximately a 90° angle with respect to the first plurality of beam passing sections, and to have a trapezoidal shape;
   a third permeable pattern formed on said substrate including a third plurality of substantially rectangular beam passing sections arranged in parallel at approximately a 180° relationship with respect to the first plurality of beam passing sections, and to have a trapezoidal shape; and
   a fourth permeable pattern formed on said substrate including a fourth plurality of substantially rectangular beam passing sections arranged in parallel at approximately a 270° with respect to the first plurality of beam passing sections, and to have a trapezoidal shape.

4. A charged particle beam mask according to claim 2, wherein adjacent sides of the trapezoidal shape form an internal angle with respect to each other of approximately 45°.

5. A charged particle beam exposure apparatus comprising:
   a beam generator for generating a charged particle beam;
   a first deflector for deflecting the charged particle beam by a desired amount;
   a first beam shaper movable to be irradiated by the charged particle beam and to shape the charged particle beam into a first shape in accordance with the position of said first beam shaper;
   a second beam shaper movable to shape the charge particle beam into a desired shape and including a substrate, and a first permeable pattern permeable to the charged particle beam and formed on said substrate including a plurality of substantially rectangular beam passing sections arranged in parallel and to have a trapezoidal shape; and
   a second deflector for deflecting the desired shaped charged particle beam to a desired location on an object.

6. A charged particle beam exposure apparatus according to claim 5, wherein said first beam shaper includes:

a beam cut-off mechanism positionable to block a portion of the charged particle beam.

7. A charged particle beam exposure apparatus according to claim 6, wherein said beam cut-off mechanism includes a plate having sides arranged in the trapezoidal shape.

8. A charged particle beam exposure apparatus comprising:
a beam generator for generating a charged particle beam;
a first deflector for deflecting the charged particle beam by a desired amount;
a first beam shaper movable to be irradiated by the charged particle beam and to shape the charged particle beam into a first shape in accordance with the position of said first beam shaper;
a second beam shaper movable to shape the charged particle beam into a desired shape and including a stencil mask having a plurality of irradiation areas formed thereon and arranged in a matrix pattern, each of said irradiation areas including a plurality of block patterns arranged in a matrix; and
a second deflector for deflecting the desired shaped particle beam to a desired location on an object,
wherein said first beam shaper includes another stencil mask having a plurality of irradiation areas formed thereon and arranged in a matrix pattern, each of said irradiation areas on said another stencil mask including another plurality of block patterns arranged in a matrix pattern.

9. A charged particle beam exposure apparatus according to claim 8, further comprising:
a third deflector for deflecting the charged particle beam having the first shape onto a desired location of the second beam shaper stencil mask.

10. A method of irradiating an object with a charged particle beam having a desired shape provided by an apparatus including a stencil mask that comprises a substrate and a first permeable pattern permeable to the charged particle beam and formed on the substrate including a plurality of substantially rectangular beam passing sections arranged in parallel and to have a trapezoidal shape, said method including the steps of:
(a) generating a rectangular shaped charged particle beam;
(b) deflecting the charged particle beam by a desired amount;
(c) shaping the charged particle beam into a first shape by blocking a portion of the charged particle beam;
(d) selectively irradiating a portion of said first permeable pattern to form the charged particle beam having a desired shape; and
(e) irradiating a desired location of the object.

11. A method of irradiating an object according to claim 10, wherein step (d) includes the substep of selectively irradiating the stencil mask to form a staircase shaped charged particle beam.

12. A method of irradiating an object according to claim 10 wherein step (d) includes the substep of selectively irradiating the stencil mask to shape the charged particle beam into a plurality of parallel linear patterns, each having an end aligned with a corresponding end of the other parallel linear patterns.

13. A method of irradiating an object according to claim 10, further comprising the step of:
rotating the stencil mask to a desired orientation.

14. A method of irradiating an object with a charged particle beam having a desired shape provided by an apparatus including first and second stencil mask, each stencil mask including a plurality of irradiation areas formed thereon and arranged in a matrix, each of the irradiation areas including a plurality of block patterns arranged in a matrix, said method including the steps of:
(a) generating a rectangular shaped charged particle beam;
(b) selectively irradiating a desired one of the block patterns on the first stencil mask to shape the charged particle beam into a first shape;
(c) selectively irradiating a desired one of the block patterns on the second stencil mask to modify the first shape into the desired shape; and
(d) irradiating a desired location of the object.

15. A method of irradiating an object according to claim 14, wherein step (b) includes the substep of:
irradiating a part of the one of the block patterns.

16. A method of irradiating an object according to claim 15, wherein step (c) includes the substep of:
:irradiating a part of the desired one of the block patterns on the second stencil mask with the charged particle beam having the first shape.

* * * * *